US012660675B2

(12) United States Patent (10) Patent No.: US 12,660,675 B2
Nakano (45) Date of Patent: Jun. 16, 2026

(54) SEMICONDUCTOR MODULE

(71) Applicant: FUJI ELECTRIC CO., LTD.,
Kawasaki (JP)

(72) Inventor: Hayato Nakano, Yamanashi (JP)

(73) Assignee: FUJI ELECTRIC CO., LTD.,
Kawasaki (JP)

( * ) Notice: Subject to any disclaimer, the term of this
patent is extended or adjusted under 35
U.S.C. 154(b) by 477 days.

(21) Appl. No.: 18/457,987

(22) Filed: Aug. 29, 2023

(65) Prior Publication Data

US 2024/0120249 A1 Apr. 11, 2024

(30) Foreign Application Priority Data

Oct. 6, 2022 (JP) ................................. 2022-161674

(51) Int. Cl.
H01L 23/31 (2006.01)
H01L 23/00 (2006.01)
H01L 23/373 (2006.01)
H01L 23/498 (2006.01)

(52) U.S. Cl.
CPC ...... H01L 23/3142 (2013.01); H01L 23/3735
(2013.01); H01L 23/49811 (2013.01); H01L
23/562 (2013.01); H01L 24/48 (2013.01);
*H01L 2224/48227* (2013.01); *H01L*
*2924/13055* (2013.01); *H01L 2924/3512*
(2013.01)

(58) Field of Classification Search
CPC .................... H01L 23/053; H01L 2924/13055
See application file for complete search history.

(56) References Cited

U.S. PATENT DOCUMENTS

| | | | | |
|---|---|---|---|---|
| 5,463,250 | A | * 10/1995 | Nguyen | .............. H01L 23/3677 |
| | | | | 257/E23.105 |
| 9,553,067 | B2 | 1/2017 | Fukami | |
| 10,643,914 | B2 | 5/2020 | Takematsu et al. | |
| 10,777,489 | B2 * | 9/2020 | Urushihata | ......... H01L 23/3142 |
| 10,959,333 | B2 * | 3/2021 | Inoue | .................... H01L 23/047 |
| 11,855,049 | B2 * | 12/2023 | Nakano | .................. H01L 24/40 |
| 2005/0093123 | A1 * | 5/2005 | Yoshida | .................. H01L 23/36 |
| | | | | 257/E23.101 |
| 2011/0115068 | A1 * | 5/2011 | Hartung | .................. H01L 24/49 |
| | | | | 257/690 |
| 2014/0117508 | A1 | 5/2014 | Nishi et al. | |
| 2016/0284660 | A1 | 9/2016 | Fukami | |

(Continued)

FOREIGN PATENT DOCUMENTS

| | | | |
|---|---|---|---|
| JP | 2014-093365 A | 5/2014 |
| JP | 2015-122349 A | 7/2015 |
| JP | 2017-041496 A | 2/2017 |

*Primary Examiner* — Evren Seven

(57) ABSTRACT

[Problem] An object of the present invention is to provide a semiconductor module capable of preventing a wire wiring from being broken because of a crack having occurred in sealing resin.
[Solution] A semiconductor module 1 includes semiconductor chips 14a to 14d, sealing resin 18 configured to seal the semiconductor chips 14a to 14d, a case 11 including a casting area 117u, first portions 111 and 112, and second portions 113 and 114, wire wirings 101a to 101j and 102a to 102i sealed in the sealing resin 18 while being located closer to the first portion 111 and connected to the semiconductor chips 14a to 14d, and recessed portions 131a, 131b, 132a, and 132b formed on the second portions 113 and 114 between a virtual surface VSu and the first portion 112.

9 Claims, 6 Drawing Sheets

(56) References Cited

U.S. PATENT DOCUMENTS

| 2017/0053847 | A1  | 2/2017 | Takematsu et al. |
| 2022/0108959 | A1* | 4/2022 | Nishimura ............ H01L 23/295 |
| 2022/0134616 | A1* | 5/2022 | Masumoto .......... H01L 21/4817 |
|  |  |  | 264/261 |
| 2024/0030101 | A1* | 1/2024 | Pavlicek ........... H01L 23/49811 |

* cited by examiner

F I G. 1
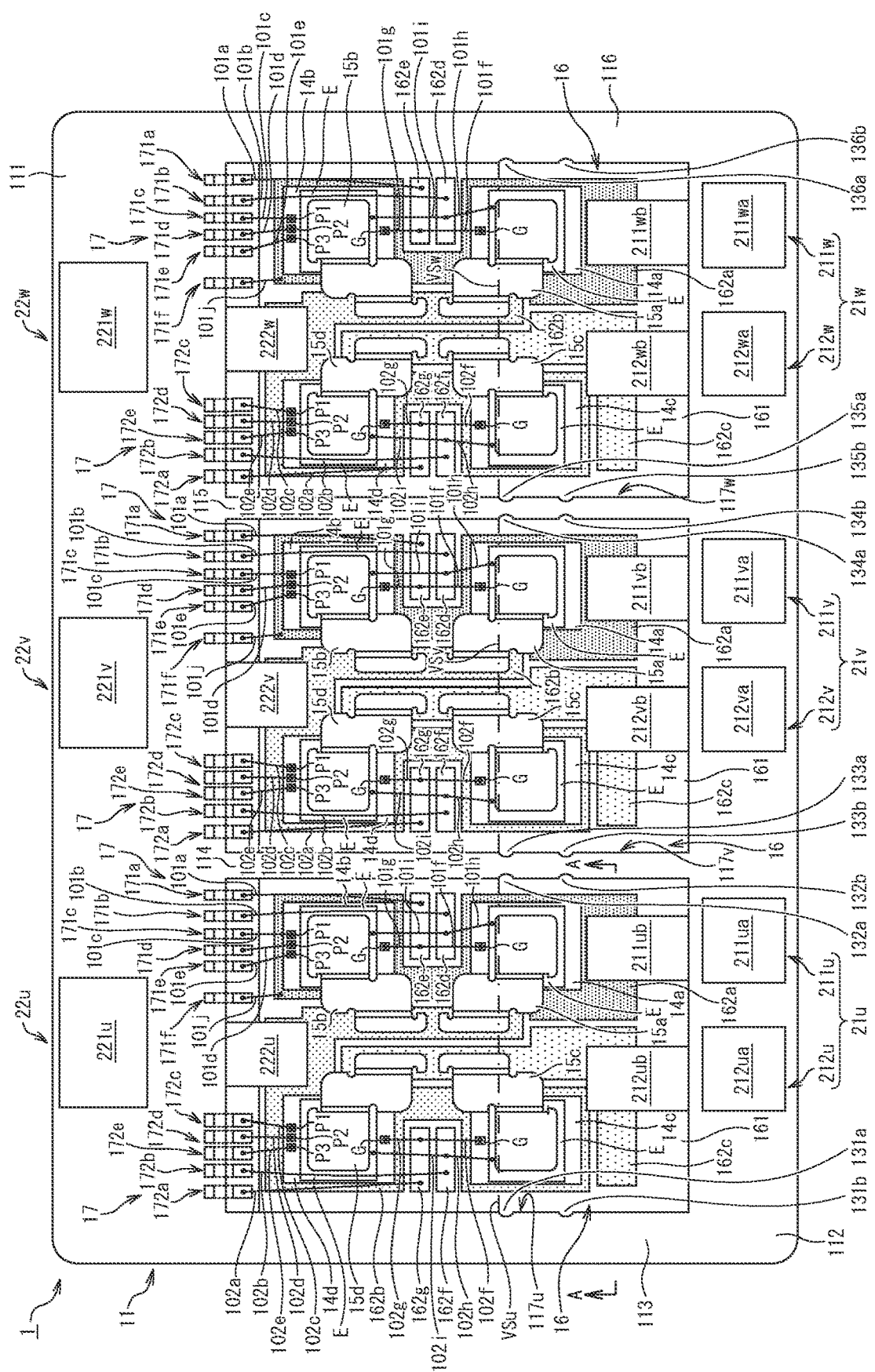

F I G. 2
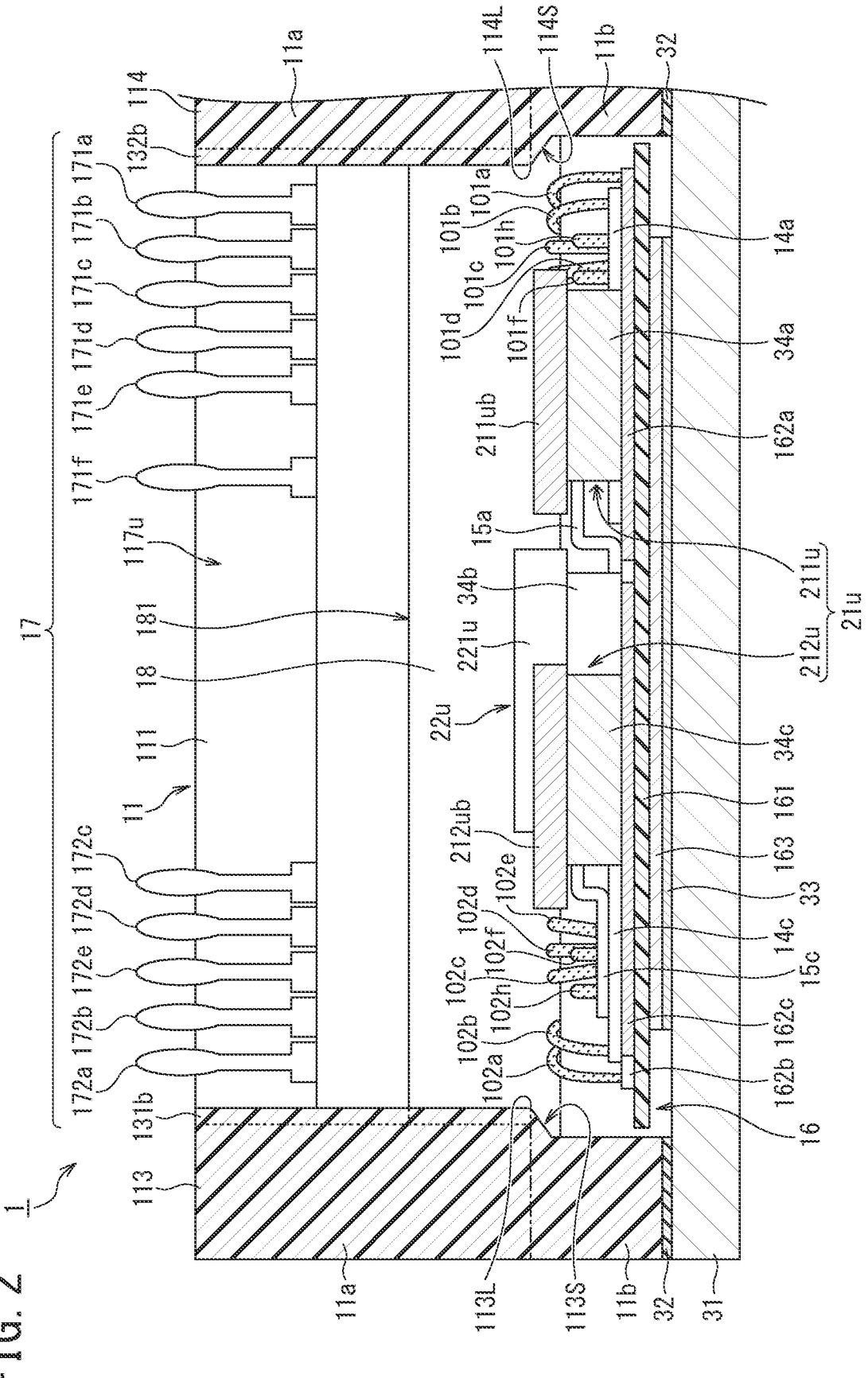

FIG. 3

SEMICONDUCTOR MODULE

CROSS-REFERENCE TO RELATED APPLICATIONS

This application claims the benefit of priority under 35 USC 119 based on Japanese Application No. 2022-161674, filed on Oct. 6, 2022, which Japanese application is incorporated by reference herein in its entirety.

TECHNICAL FIELD

The present invention relates to a semiconductor module that includes sealing resin sealing a semiconductor chip.

BACKGROUND ART

Semiconductor modules having a 6-in-1 structure, such as an in-vehicle power module, have been known. Such a semiconductor module has a case and a power cell connected to each other by wire wiring and includes an electric circuit that generates electric power to be supplied to an externally disposed load, such as a motor. The power cell is sealed by sealing resin.

In order to estimate an operating life of a semiconductor module, a power cycle test (intermittent energization test) is performed. The power cycle test includes a ΔTj power cycle test in which thermal stress is generated in a semiconductor chip disposed in a power cell and a ΔTc power cycle test (thermal fatigue life test) in which case temperature is changed. Since performing the ΔTj power cycle test and the ΔTc power cycle test causes stress to be repeatedly generated in sealing resin, a crack occurs in the sealing resin.

In Patent Document 1, a semiconductor device capable of self-repairing a crack or a peeling occurring in sealing material is disclosed. In Patent Document 2, a technology for preventing a crack from occurring in an electrode layer is disclosed. In Patent Document 3, a semiconductor device capable of, by relaxing stress, preventing breakage of an insulating substrate and also preventing a fragment of the insulating substrate from scattering even when the insulating substrate is broken is disclosed.

CITATION LIST

Patent Literature

Patent Document 1: JP 2017-41496 A
Patent Document 2: JP 2015-122349 A
Patent Document 3: JP 2014-93365 A

SUMMARY OF INVENTION

Technical Problem

Occurrence of a crack in sealing resin does not necessarily lead to a significant defect for a semiconductor module. However, wire wiring being broken caused by the crack reaching the wire wiring becomes a significant defect for the semiconductor module, as a result of which the semiconductor module becomes a defective module.

An object of the present invention is to provide a semiconductor module capable of preventing a wire wiring from being broken because of a crack having occurred in sealing resin.

Solution to Problem

In order to achieve the above-described object, a semiconductor module according to one aspect of the present invention includes a semiconductor chip, sealing resin configured to seal the semiconductor chip, a case including a space into which the sealing resin is cast, a pair of first portions arranged opposite to each other with the space interposed between the first portions and having a linear shape, and a pair of second portions arranged opposite to each other with the space interposed between the second portions between the first portions and having a linear shape, a wire wiring sealed by the sealing resin while being located closer to one of the pair of first portions and connected to the semiconductor chip and through which a signal input to the semiconductor chip or output from the semiconductor chip is transmitted, and at least one recessed portion formed on at least one of the pair of second portions between a virtual surface, the virtual surface being a boundary between an area in the space in which the wire wiring is arranged and an area in the space in which the wire wiring is not arranged and being parallel with the pair of first portions, and the other of the pair of first portions.

Advantageous Effects of Invention

One aspect of the present invention enables a wire wiring to be prevented from being broken because of a crack having occurred in sealing resin.

BRIEF DESCRIPTION OF DRAWINGS

FIG. 1 is a diagram schematically illustrative of an example of a plane of a semiconductor module according to one embodiment of the present invention.

FIG. 2 is a diagram illustrative of an example of a schematic configuration of the semiconductor module according to the one embodiment of the present invention and is a diagram schematically illustrative of a cross section taken along the line A-A illustrated in FIG. 1.

FIG. 3 is a diagram for a description of a crack occurring in sealing resin included in the semiconductor module according to the one embodiment of the present invention and is a diagram schematically illustrative of a portion of the plane of the semiconductor module.

DESCRIPTION OF EMBODIMENTS

Figure 4:
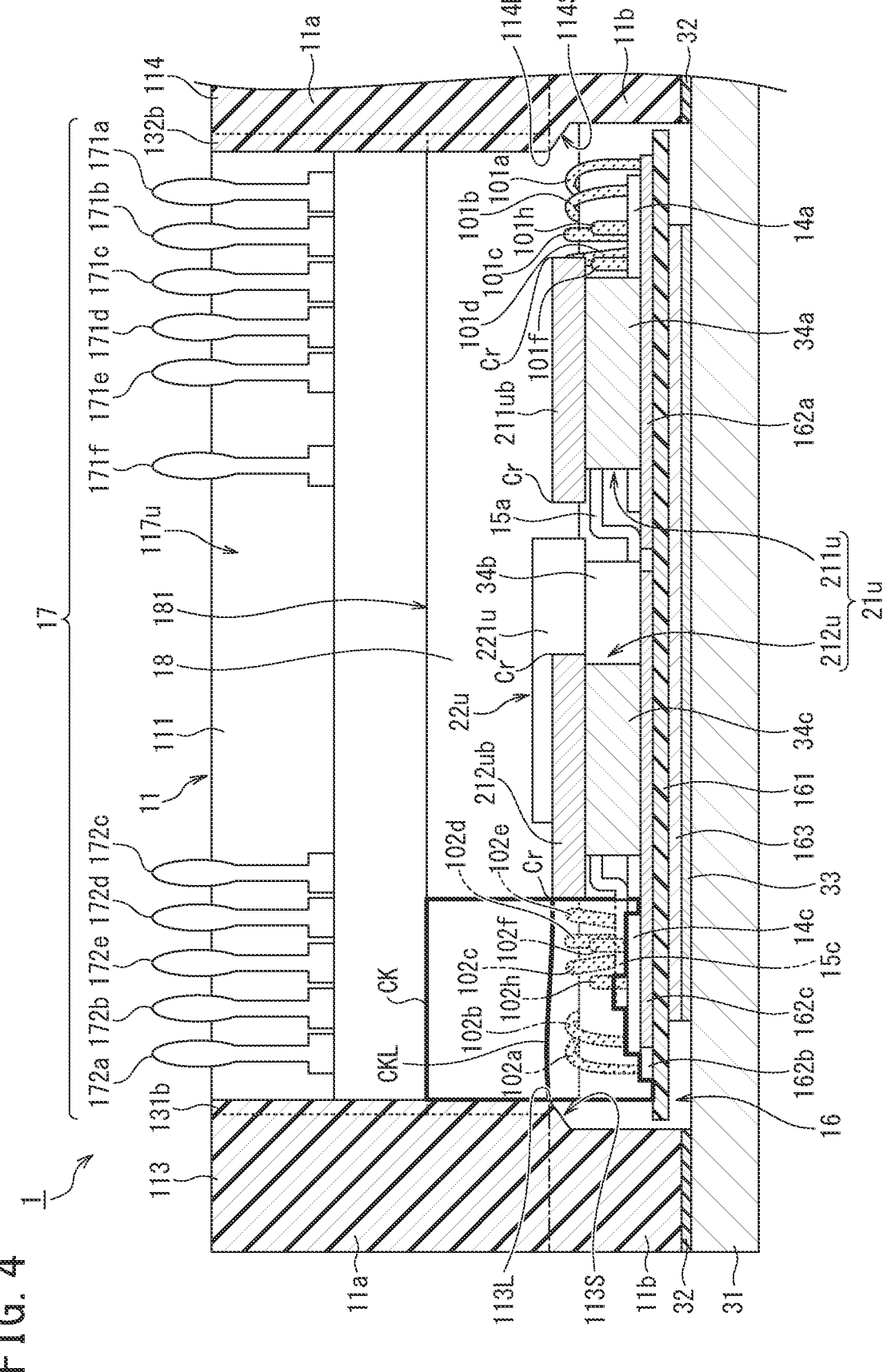
FIG. 4 is another diagram for a description of the crack occurring in the sealing resin included in the semiconductor module according to the one embodiment of the present invention and is a diagram schematically illustrative of a cross section of the semiconductor module taken along the line B-B illustrated in FIG. 3.

The embodiments of the present invention indicate devices and methods to embody the technical idea of the present invention by way of example, and the technical idea of the present invention does not limit the materials, shapes, structures, arrangements, and the like of the constituent components to those described below. The technical idea of the present invention can be subjected to a variety of alterations within the technical scope prescribed by the claims described in CLAIMS.

Figure 3:
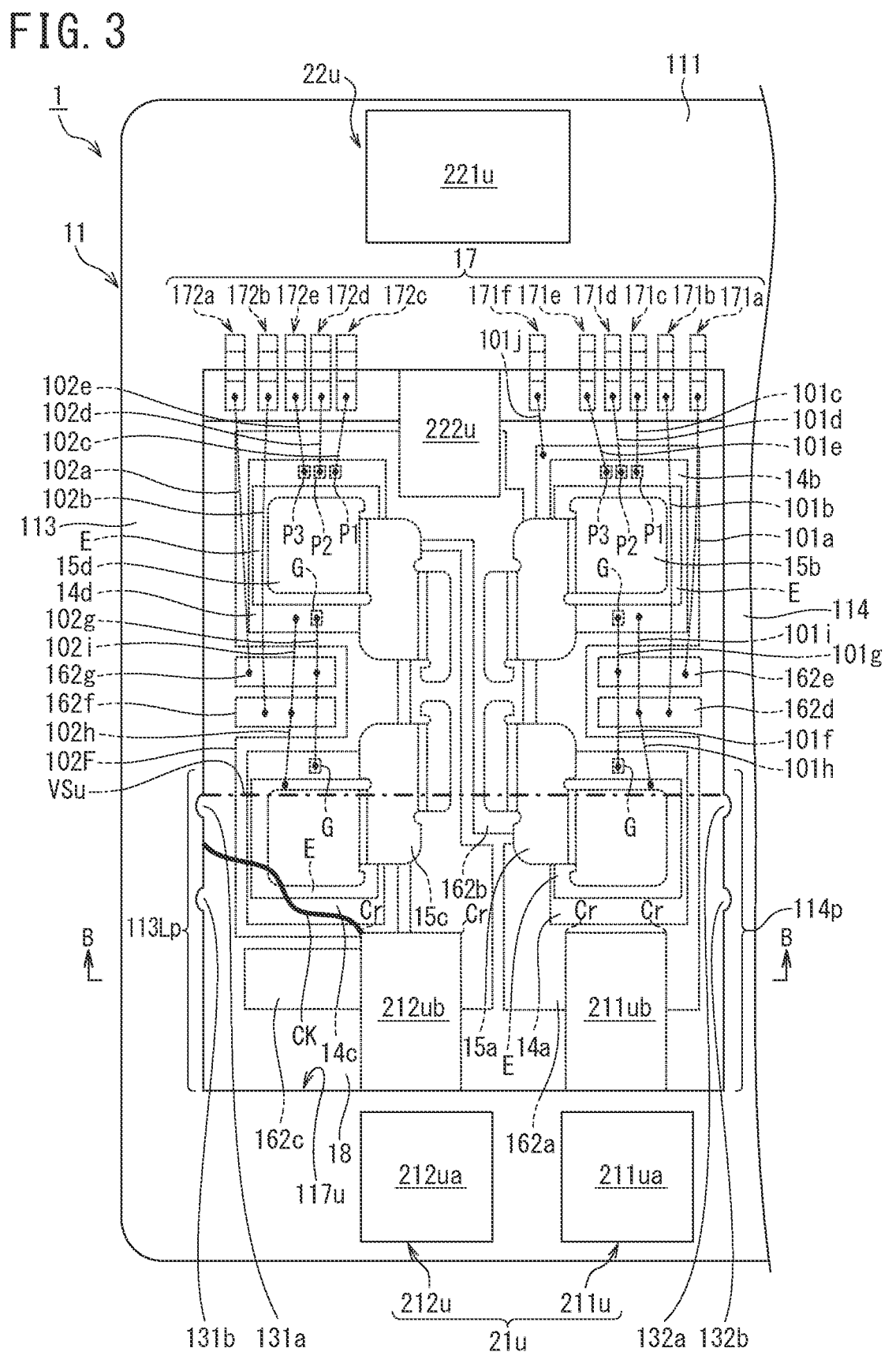

A semiconductor module according to one embodiment of the present invention will be described using FIGS. 1 to 6. First, a schematic configuration of a semiconductor module 1 according to the present embodiment will be described using FIGS. 1 and 2. The following description will be made using, for example, a three-phase power conversion module that can convert DC to AC as an example of the semiconductor module 1 according to the present embodiment. FIG. 1 is a diagram schematically illustrative of an example of a plane of the semiconductor module 1. Herein, a plan view of the semiconductor module 1 is a diagram viewed in the thickness direction of sealing resin 18 (see FIG. 2) included in the semiconductor module 1. In FIG. 1, to facilitate understanding, illustration of the sealing resin 18 is omitted. FIG. 2 is a diagram schematically illustrative of a cross section of the semiconductor module 1 taken along the line A-A illustrated in FIG. 1.

As illustrated in FIG. 1, the semiconductor module 1 according to the present embodiment includes a case 11 including a casting area (an example of a space) 117u into which the sealing resin 18 (details will be described later) is cast, a pair of first portions 111 and 112 that are arranged opposite to each other with the casting area 117u interposed therebetween and have a linear shape, and a pair of second portions 113 and 114 that are opposite to each other with the casting area 117u interposed therebetween, are arranged between the first portions 111 and 112, and have a linear shape. The case 11 defines the casting area 117u by the first portions 111 and 112 and the second portions 113 and 114.

The case 11 includes a second portion 115 that is opposite to the second portion 114 with a casting area 117v interposed therebetween, is arranged between the first portions 111 and 112, and has a linear shape. The case 11 defines the casting area 117v by the first portions 111 and 112 and the second portions 114 and 115. When the casting area 117v is focused on, the second portions 114 and 115 constitute a pair of second portions.

The case 11 includes a second portion 116 that is opposite to the second portion 115 with a casting area 117w interposed therebetween, is arranged between the first portions 111 and 112, and has a linear shape. The case 11 defines the casting area 117w by the first portions 111 and 112 and the second portions 115 and 116. When the casting area 117w is focused on, the second portions 115 and 116 constitute a pair of second portions.

The case 11 includes a plurality of casting areas 117u, 117v, and 117w. The first portions 111 and 112 are shared as some of constituent elements defining each of the casting areas 117u, 117v, and 117w. At least one of the second portions 113, 114, 115, and 116 is shared as one of the constituent elements defining each of the casting areas 117u, 117v, and 117w adjacent to each other.

Specifically, the casting area 117u is defined by a portion of the first portion 111, the second portion 114, a portion of the first portion 112, and the second portion 113. The casting area 117v is defined by another portion of the first portion 111, the second portion 115, another portion of the first portion 112, and the second portion 114. The casting area 117w is defined by the remaining portion of the first portion 111, the second portion 116, the remaining portion of the first portion 112, and the second portion 115. Therefore, the second portion 114 is shared as one of the constituent elements defining each of the casting area 117u and the casting area 117v adjacent to each other. The second portion

115 is shared as one of the constituent elements defining each of the casting area 117v and the casting area 117w adjacent to each other.

The case 11 has a rectangular ring shape that is formed by the first portion 111, the second portion 116, the first portion 112, and the second portion 113 as viewed in the thickness direction of the sealing resin 18 (that is, as viewed in plan). The second portion 114 is arranged adjacent to the second portion 113, and the second portion 115 is arranged between the second portions 114 and 116. The second portions 113, 114, 115, and 116 are, for example, arranged at equal intervals. Because of this configuration, the casting areas 117u, 117v, and 117w have substantially the same size as one another. The first portions 111 and 112 and the second portions 113, 114, 115, and 116 are integrally formed using, for example, insulating thermoplastic resin.

As illustrated in FIG. 1, the semiconductor module 1 includes semiconductor chips 14a, 14b, 14c, and 14d that are arranged in the casting area 117u. Hereinafter, the semiconductor chips 14a, 14b, 14c, and 14d are sometimes abbreviatedly referred to as "semiconductor chips 14a to 14d". The semiconductor module 1 includes wire wirings 101a, 101b, 101c, 101d, 101e, 101f, 101g, 101h, 101i, 101j, 102a, 102b, 102c, 102d, 102e, 102f, 102g, 102h, and 102i that are sealed in the sealing resin 18 while being located closer to one of the pair of first portions 111 and 112 (in the present embodiment, the first portion 111) and are connected to the semiconductor chips 14a to 14d and through which signals input to the semiconductor chips 14a to 14d or output from the semiconductor chips 14a to 14d are transmitted. Hereinafter, the wire wirings 101a, 101b, 101c, 101d, 101e, 101f, 101g, 101h, 101i, and 101j are sometimes abbreviatedly referred to as "wire wirings 101a to 101j", and the wire wirings 102a, 102b, 102c, 102d, 102e, 102f, 102g, 102h, and 102i are sometimes abbreviatedly referred to as "wire wirings 102a to 102i".

The semiconductor module 1 includes the sealing resin 18 (not illustrated in FIG. 1, see FIG. 2) that is cast into the casting area 117u and seals the semiconductor chips 14a to 14d. As described above, the sealing resin 18 also seals the wire wirings 101a to 101j and 102a to 102i.

The semiconductor module 1 includes semiconductor chips 14a to 14d that are arranged in the casting area 117v. The semiconductor module 1 includes sealing resin (not illustrated) that is cast into the casting area 117v and seals the semiconductor chips 14a to 14d. The semiconductor module 1 includes wire wirings 101a to 101j and 102a to 102i that are sealed in the sealing resin cast into the casting area 117v while being located closer to one of the pair of first portions 111 and 112 (in the present embodiment, the first portion 111) and are connected to the semiconductor chips 14a to 14d and through which signals input to the semiconductor chips 14a to 14d or output from the semiconductor chips 14a to 14d are transmitted.

The semiconductor module 1 includes semiconductor chips 14a to 14d that are arranged in the casting area 117w. The semiconductor module 1 includes sealing resin (not illustrated) that is cast into the casting area 117w and seals the semiconductor chips 14a to 14d. The semiconductor module 1 includes wire wirings 101a to 101j and 102a to 102i that are sealed in the sealing resin cast into the casting area 117w while being located closer to one of the pair of first portions 111 and 112 (in the present embodiment, the first portion 111) and are connected to the semiconductor chips 14a to 14d and through which signals input to the semiconductor chips 14a to 14d or output from the semiconductor chips 14a to 14d are transmitted.

As illustrated in FIG. 1, the semiconductor module 1 includes a power input terminal 21*u* that is disposed in one of the first portions 111 and 112 (in the present embodiment, the first portion 112) while a portion of the power input terminal 21*u* is arranged in the casting area 117*u* and to which power to be supplied to the semiconductor chips 14*a* to 14*d* is input. The power input terminal 21*u* includes a positive electrode-side terminal 211*u* through which, for example, the positive electrode side of DC power is supplied and a negative electrode-side terminal 212*u* through which, for example, the negative electrode side of the DC power is supplied. The semiconductor module 1 includes a power output terminal 22*u* that is disposed in the other of the first portions 111 and 112 (in the present embodiment, the first portion 111) while a portion of the power output terminal 22*u* is arranged in the casting area 117*u* and from which power from the semiconductor chips 14*a* to 14*d* is output. The power input terminal 21*u* (more specifically, the positive electrode-side terminal 211*u* and the negative electrode-side terminal 212*u*) and the power output terminal 22*u* are formed of a conductive material (for example, copper).

The positive electrode-side terminal 211*u* includes a fastening portion 211*ua* that is arranged on the first portion 112 and to which a cable (not illustrated) connected to the positive electrode side of a DC power source (not illustrated) generating the DC power is fastened. The fastening portion 211*ua* is exposed on the first portion 112. The positive electrode-side terminal 211*u* includes a projecting portion 211*ub* that is arranged in a projecting manner to the casting area 117*u*. Therefore, the positive electrode-side terminal 211*u* is disposed in the first portion 112 with the projecting portion 211*ub* (an example of a portion) arranged in the casting area 117*u*.

The negative electrode-side terminal 212*u* includes a fastening portion 212*ua* that is arranged on the first portion 112 and to which a cable (not illustrated) connected to the negative electrode side of the DC power source (not illustrated) generating the DC power is fastened. The fastening portion 212*ua* is exposed on the first portion 112. The negative electrode-side terminal 212*u* includes a projecting portion 212*ub* that is arranged in a projecting manner to the casting area 117*u*. Therefore, the negative electrode-side terminal 212*u* is disposed in the first portion 112 with the projecting portion 212*ub* (an example of the portion) arranged in the casting area 117*u*.

The power output terminal 22*u* includes a fastening portion 221*u* that is arranged on the first portion 111 and to which a cable (not illustrated) connected to a load (not illustrated) serving as a drive target is fastened. The fastening portion 221*u* is exposed on the first portion 111. The power output terminal 22*u* includes a projecting portion 222*u* that is arranged in a projecting manner to the casting area 117*u*. Therefore, the power output terminal 22*u* is disposed in the first portion 111 with the projecting portion 222*u* (an example of a portion) arranged in the casting area 117*u*.

As illustrated in FIG. 1, the semiconductor module 1 includes a power input terminal 21*v* that is disposed in one of the first portions 111 and 112 (in the present embodiment, the first portion 112) while a portion of the power input terminal 21*v* is arranged in the casting area 117*v* and to which power to be supplied to the semiconductor chips 14*a* to 14*d* is input. The power input terminal 21*v* includes a positive electrode-side terminal 211*v* through which, for example, the positive electrode side of the DC power is supplied and a negative electrode-side terminal 212*v* through which, for example, the negative electrode side of the DC power is supplied. The semiconductor module 1 includes a power output terminal 22*v* that is disposed in the other of the first portions 111 and 112 (in the present embodiment, the first portion 111) while a portion of the power output terminal 22*v* is arranged in the casting area 117*v* and from which power from the semiconductor chips 14*a* to 14*d* is output. The power input terminal 21*v* (more specifically, the positive electrode-side terminal 211*v* and the negative electrode-side terminal 212*v*) and the power output terminal 22*v* are formed of a conductive material (for example, copper).

The positive electrode-side terminal 211*v* includes a fastening portion 211*va* that is arranged on the first portion 112 and to which a cable (not illustrated) connected to the positive electrode side of the DC power source (not illustrated) generating the DC power is fastened. The fastening portion 211*va* is exposed on the first portion 112. The positive electrode-side terminal 211*v* includes a projecting portion 211*vb* that is arranged in a projecting manner to the casting area 117*v*. Therefore, the positive electrode-side terminal 211*v* is disposed in the first portion 112 with the projecting portion 211*vb* (an example of the portion) arranged in the casting area 117*v*.

The negative electrode-side terminal 212*v* includes a fastening portion 212*va* that is arranged on the first portion 112 and to which a cable (not illustrated) connected to the negative electrode side of the DC power source (not illustrated) generating the DC power is fastened. The fastening portion 212*va* is exposed on the first portion 112. The negative electrode-side terminal 212*v* includes a projecting portion 212*vb* that is arranged in a projecting manner to the casting area 117*v*. Therefore, the negative electrode-side terminal 212*v* is disposed in the first portion 112 with the projecting portion 212*vb* (an example of the portion) arranged in the casting area 117*v*.

The power output terminal 22*v* includes a fastening portion 221*v* that is arranged on the first portion 111 and to which a cable (not illustrated) connected to the load (not illustrated) serving as a drive target is fastened. The fastening portion 221*v* is exposed on the first portion 111. The power output terminal 22*v* includes a projecting portion 222*v* that is arranged in a projecting manner to the casting area 117*v*. Therefore, the power output terminal 22*v* is disposed in the first portion 111 with the projecting portion 222*v* (an example of the portion) arranged in the casting area 117*v*.

As illustrated in FIG. 1, the semiconductor module 1 includes a power input terminal 21*w* that is disposed in one of the first portions 111 and 112 (in the present embodiment, the first portion 112) while a portion of the power input terminal 21*w* is arranged in the casting area 117*w* and to which power to be supplied to the semiconductor chips 14*a* to 14*d* is input. The power input terminal 21*w* includes a positive electrode-side terminal 211*w* through which, for example, the positive electrode side of the DC power is supplied and a negative electrode-side terminal 212*w* through which, for example, the negative electrode side of the DC power is supplied. The semiconductor module 1 includes a power output terminal 22*w* that is disposed in the other of the first portions 111 and 112 (in the present embodiment, the first portion 111) while a portion of the power output terminal 22*w* is arranged in the casting area 117*w* and from which power from the semiconductor chips 14*a* to 14*d* is output. The power input terminal 21*w* (more specifically, the positive electrode-side terminal 211*w* and the negative electrode-side terminal 212*w*) and the power output terminal 22*w* are formed of a conductive material (for example, copper).

The positive electrode-side terminal 211*w* includes a fastening portion 211*wa* that is arranged on the first portion 112 and to which a cable (not illustrated) connected to the positive electrode side of the DC power source (not illustrated) generating the DC power is fastened. The fastening portion 211*wa* is exposed on the first portion 112. The positive electrode-side terminal 211*w* includes a projecting portion 211*wb* that is arranged in a projecting manner to the casting area 117*w*. Therefore, the positive electrode-side terminal 211*w* is disposed in the first portion 112 with the projecting portion 211*wb* (an example of the portion) arranged in the casting area 117*w*.

The negative electrode-side terminal 212*w* includes a fastening portion 212*wa* that is arranged on the first portion 112 and to which a cable (not illustrated) connected to the negative electrode side of the DC power source (not illustrated) generating the DC power is fastened. The fastening portion 212*wa* is exposed on the first portion 112. The negative electrode-side terminal 212*w* includes a projecting portion 212*wb* that is arranged in a projecting manner to the casting area 117*w*. Therefore, the negative electrode-side terminal 212*w* is disposed in the first portion 112 with the projecting portion 212*wb* (an example of the portion) arranged in the casting area 117*w*.

The power output terminal 22*w* includes a fastening portion 221*w* that is arranged on the first portion 111 and to which a cable (not illustrated) connected to the load (not illustrated) serving as a drive target is fastened. The fastening portion 221*w* is exposed on the first portion 111. The power output terminal 22*w* includes a projecting portion 222*w* that is arranged in a projecting manner to the casting area 117*w*. Therefore, the power output terminal 22*w* is disposed in the first portion 111 with the projecting portion 222*w* (an example of the portion) arranged in the casting area 117*w*.

As illustrated in FIG. 2, the semiconductor module 1 includes a cooler 31 to which the case 11 is fixed. The cooler 31 is formed of a material having high thermal conductivity (for example, aluminum). The case 11 is fixed to the cooler 31 with an end on the opposite side to a side on which the fastening portions 211*ua*, 212*ua*, and 221*u* are exposed adhered to the cooler 31 by adhesive agent 32 for example. Because of this configuration, the casting area 117*u* that is surrounded in five directions by the first portion 111, the second portion 114, the first portion 112, and the second portion 113 of the case 11 and the cooler 31 and has the side on which the fastening portions 211*ua*, 212*ua*, and 221*u* are exposed opened is formed. In addition, the casting area 117*v* that is surrounded in five directions by the first portion 111, the second portion 115, the first portion 112, and the second portion 114 of the case 11 and the cooler 31 and has the side on which the fastening portions 211*va*, 212*va*, and 221*v* are exposed opened is formed. Further, the casting area 117*w* that is surrounded in five directions by the first portion 111, the second portion 116, the first portion 112, and the second portion 115 of the case 11 and the cooler 31 and has the side on which the fastening portions 211*wa*, 212*wa*, and 221*w* are exposed opened is formed.

Configurations of inverter units that are each arranged in the casting areas 117*u*, 117*v*, and 117*w*, convert the DC power input from the power input terminals 21*u*, 21*v*, and 21*w* to AC power, and output the AC power from the power output terminals 22*u*, 22*v*, and 22*w* will be described below. An inverter unit for a U-phase that is arranged in the casting area 117*u*, an inverter unit for a V-phase that is arranged in the casting area 117*v*, and an inverter unit for a W-phase that is arranged in the casting area 117*w* have the same configuration as one another. Therefore, the inverter unit for the U-phase, the inverter unit for the V-phase, and the inverter unit for the W-phase will be described using the inverter unit for the U-phase as an example.

As illustrated in FIGS. 1 and 2, the inverter unit for the U-phase includes a laminated substrate 16 on which the semiconductor chips 14*a* to 14*d* are arranged. The laminated substrate 16 is formed by, for example, a direct copper bonding (DCB) substrate or an active metal brazing (AMB) substrate. The laminated substrate 16 includes an insulating substrate 161 that has a larger area than the opening of the casting area 117*u* on the side on which the fastening portions 211*ua*, 212*ua*, and 221*u* are exposed and is formed in a rectangular flat plate shape. The insulating substrate 161 is formed of ceramic, such as alumina ($Al_2O_3$) and aluminum nitride (AlN).

The laminated substrate 16 includes a positive electrode-side wiring pattern 162*a*, an intermediate wiring pattern 162*b*, a negative electrode-side wiring pattern 162*c*, and relay wiring patterns 162*d*, 162*e*, 162*f*, and 162*g* that are formed on the side of the insulating substrate 161 that is sealed by the sealing resin 18 (see FIG. 2). The positive electrode-side wiring pattern 162*a*, the intermediate wiring pattern 162*b*, the negative electrode-side wiring pattern 162*c*, and the relay wiring patterns 162*d*, 162*e*, 162*f*, and 162*g* are formed of a conductive material (for example, copper). The laminated substrate 16 includes a rectangular flat plate-shaped heat conduction pattern 163 (see FIG. 2) that is formed on a back surface side of the insulating substrate 161 that is the opposite side to the side sealed by the sealing resin 18. The heat conduction pattern 163 is formed of a material having high thermal conductivity (for example, copper).

The laminated substrate 16 is soldered to the cooler 31, using, for example, solder 33. The laminated substrate 16 is fixed to the cooler 31 with the heat conduction pattern 163 in contact with the solder 33. Because of this configuration, the semiconductor module 1 is capable of discharging heat generated from the semiconductor chips 14*a* to 14*d* disposed on the laminated substrate 16 to the outside via the cooler 31.

As illustrated in FIG. 1, the positive electrode-side wiring pattern 162*a* is, for example, arranged extending along the second portion 114 between the projecting portion 222*u* of the power output terminal 22*u* and the second portion 114. The positive electrode-side wiring pattern 162*a* has, at a central portion thereof, a recessed portion that is recessed from the second portion 114 toward a central portion of the casting area 117*u*. The relay wiring patterns 162*d* and 162*e* are arranged side by side in the recessed portion. The relay wiring patterns 162*d* and 162*e* each have, for example, a rectangular shape and have the same shape as each other. The relay wiring pattern 162*d* is arranged on the power input terminal 21*u* side, and the relay wiring pattern 162*e* is arranged on the power output terminal 22*u* side.

The negative electrode-side wiring pattern 162*c* is, for example, arranged extending from a vicinity of a corner portion of the case 11 where the first portion 112 and the second portion 113 intersect to underneath the projecting portion 212*ub* of the negative electrode-side terminal 212*u* along the first portion 112 and, going through a central portion of the insulating substrate 161, further extending to a vicinity of the projecting portion 222*u* of the power output terminal 22*u*. The negative electrode-side wiring pattern 162*c* has, for example, a laterally reversed L-shape.

The intermediate wiring pattern 162*b* is, for example, arranged in such a manner as to surround a portion of the negative electrode-side wiring pattern 162*c* that goes through a central portion of the insulating substrate 161 and extends to a vicinity of the projecting portion 222*u* of the power output terminal 22*u*. The intermediate wiring pattern 162*b* has, for example, a recessed shape. Some area of the intermediate wiring pattern 162*b* that extends in the central portion of the insulating substrate 161 is arranged between the positive electrode-side wiring pattern 162*a* and the negative electrode-side wiring pattern 162*c*.

The intermediate wiring pattern 162*b* has, at a central portion of a portion thereof that extends along the second portion 113, a recessed portion that is recessed from the second portion 113 toward the central portion of the casting area 117*u*. The relay wiring patterns 162*f* and 162*g* are arranged side by side in the recessed portion. The relay wiring patterns 162*f* and 162*g* each have, for example, a rectangular shape and have the same shape as each other. The relay wiring pattern 162*f* is arranged on the power input terminal 21*u* side, and the relay wiring pattern 162*g* is arranged on the power output terminal 22*u* side.

The projecting portion 211*ub* of the positive electrode-side terminal 211*u* is arranged extending to over the positive electrode-side wiring pattern 162*a*. The positive electrode-side terminal 211*u* is connected to the positive electrode-side wiring pattern 162*a* by a connection member 34*a* (see FIG. 2) that is arranged in a portion of an area where the projecting portion 211*ub* and the positive electrode-side wiring pattern 162*a* overlap each other. The connection member 34*a* has, for example, a rectangular parallelepiped shape and is formed of a conductive material (for example, copper). The connection member 34*a* is, for example, soldered to the positive electrode-side wiring pattern 162*a*. The projecting portion 211*ub* is bonded to the connection member 34*a* by, for example, laser welding. Because of this configuration, the positive electrode-side terminal 211*u* and the positive electrode-side wiring pattern 162*a* are mechanically and electrically connected to each other via the connection member 34*a*.

The projecting portion 212*ub* of the negative electrode-side terminal 212*u* is arranged extending to over the negative electrode-side wiring pattern 162*c*. The negative electrode-side terminal 212*u* is connected to the negative electrode-side wiring pattern 162*c* by a connection member 34*c* (see FIG. 2) that is arranged in a portion of an area where the projecting portion 212*ub* and the negative electrode-side wiring pattern 162*c* overlap each other. The connection member 34*c* has, for example, a rectangular parallelepiped shape and is formed of a conductive material (for example, copper). The connection member 34*c* is, for example, soldered to the negative electrode-side wiring pattern 162*c*. The projecting portion 212*ub* is bonded to the connection member 34*c* by, for example, laser welding. Because of this configuration, the negative electrode-side terminal 212*u* and the negative electrode-side wiring pattern 162*c* are mechanically and electrically connected to each other via the connection member 34*c*.

The projecting portion 222*u* of the power output terminal 22*u* is arranged extending to over the intermediate wiring pattern 162*b*. The power output terminal 22*u* is connected to the intermediate wiring pattern 162*b* by a connection member 34*b* (see FIG. 2) that is arranged in a portion of an area where the projecting portion 222*u* and the intermediate wiring pattern 162*b* overlap each other. The connection member 34*b* has, for example, a rectangular parallelepiped shape and is formed of a conductive material (for example, copper). The connection member 34*b* is, for example, soldered to the intermediate wiring pattern 162*b*. The projecting portion 222*u* is bonded to the connection member 34*b* by, for example, laser welding. Because of this configuration, the power output terminal 22*u* and the intermediate wiring pattern 162*b* are mechanically and electrically connected to each other via the connection member 34*b*.

As illustrated in FIG. 1, the semiconductor chip 14*a* and the semiconductor chip 14*b* are arranged on the positive electrode-side wiring pattern 162*a* with the relay wiring patterns 162*d* and 162*e* interposed therebetween. The semiconductor chips 14*a* and 14*b* are, for example, bonded to the positive electrode-side wiring pattern 162*a* by sintered bodies formed on the positive electrode-side wiring pattern 162*a*. Because of this configuration, the semiconductor chips 14*a* and 14*b* are mechanically and electrically connected to the positive electrode-side wiring pattern 162*a*.

The semiconductor chip 14*c* and the semiconductor chip 14*d* are arranged on the intermediate wiring pattern 162*b* with the relay wiring patterns 162*f* and 162*g* interposed therebetween. The semiconductor chips 14*c* and 14*d* are, for example, bonded to the intermediate wiring pattern 162*b* by sintered bodies formed on the intermediate wiring pattern 162*b*. Because of this configuration, the semiconductor chips 14*c* and 14*d* are mechanically and electrically connected to the intermediate wiring pattern 162*b*.

As illustrated in FIG. 1, the semiconductor module 1 includes, for example, a lead frame 15*a* configured to mechanically and electrically connect the semiconductor chip 14*a* and the intermediate wiring pattern 162*b* to each other and a lead frame 15*b* configured to mechanically and electrically connect the semiconductor chip 14*b* and the intermediate wiring pattern 162*b* to each other. The semiconductor module 1 includes, for example, a lead frame 15*c* configured to mechanically and electrically connect the semiconductor chip 14*c* and the negative electrode-side wiring pattern 162*c* to each other and a lead frame 15*d* configured to mechanically and electrically connect the semiconductor chip 14*d* and the negative electrode-side wiring pattern 162*c* to each other.

In each of the semiconductor chips 14*a*, 14*b*, 14*c*, and 14*d*, a power semiconductor element (not illustrated), such as an insulated gate bipolar transistor (IGBT) and a metal-oxide-semiconductor field-effect transistor (MOSFET), is formed. In the present embodiment, for example, an IGBT (not illustrated) is formed in each of the semiconductor chips 14*a*, 14*b*, 14*c*, and 14*d*. In addition, in each of the semiconductor chips 14*a*, 14*b*, 14*c*, and 14*d*, a free wheeling diode (not illustrated) that is connected in inverse parallel to an IGBT is formed.

A collector terminal (not illustrated) of the IGBT and a cathode terminal (not illustrated) of the free wheeling diode that are formed in the semiconductor chip 14*a* are exposed on a surface opposed to the positive electrode-side wiring pattern 162*a* and are mechanically and electrically connected to the positive electrode-side wiring pattern 162*a* via the sintered body. An emitter terminal E of the IGBT and an anode terminal (not illustrated) of the free wheeling diode that are formed in the semiconductor chip 14*a* are exposed on a portion of a surface on the side on which the lead frame 15*a* is arranged and are mechanically and electrically connected to an end of the lead frame 15*a*.

A collector terminal (not illustrated) of the IGBT and a cathode terminal (not illustrated) of the free wheeling diode that are formed in the semiconductor chip 14*b* are exposed on a surface opposed to the positive electrode-side wiring pattern 162*a* and are mechanically and electrically connected to the positive electrode-side wiring pattern 162a via the sintered body. An emitter terminal E of the IGBT and an anode terminal (not illustrated) of the free wheeling diode that are formed in the semiconductor chip 14b are exposed on a portion of a surface on the side on which the lead frame 15b is arranged and are mechanically and electrically connected to an end of the lead frame 15b.

Therefore, the IGBT and the free wheeling diode disposed in the semiconductor chip 14a and the IGBT and the free wheeling diode disposed in the semiconductor chip 14b are connected in parallel between the positive electrode-side terminal 211u and the power output terminal 22u by the connection member 34a, the positive electrode-side wiring pattern 162a, the lead frames 15a and 15b, the intermediate wiring pattern 162b, and the connection member 34b.

A collector terminal (not illustrated) of the IGBT and a cathode terminal (not illustrated) of the free wheeling diode that are formed in the semiconductor chip 14c are exposed on a surface opposed to the intermediate wiring pattern 162b and are mechanically and electrically connected to the sintered body. An emitter terminal E of the IGBT and an anode terminal (not illustrated) of the free wheeling diode that are formed in the semiconductor chip 14c are exposed on a portion of a surface on the side on which the lead frame 15c is arranged and are mechanically and electrically connected to an end of the lead frame 15c.

A collector terminal (not illustrated) of the IGBT and a cathode terminal (not illustrated) of the free wheeling diode that are formed in the semiconductor chip 14d are exposed on a surface opposed to the intermediate wiring pattern 162b and are mechanically and electrically connected to the sintered body. An emitter terminal E of the IGBT and an anode terminal (not illustrated) of the free wheeling diode that are formed in the semiconductor chip 14d are exposed on a portion of a surface on the side on which the lead frame 15d is arranged and are mechanically and electrically connected to an end of the lead frame 15d.

Therefore, the IGBT and the free wheeling diode disposed in the semiconductor chip 14c and the IGBT and the free wheeling diode disposed in the semiconductor chip 14d are connected in parallel between the power output terminal 22u and the negative electrode-side terminal 212u by the connection member 34b, the intermediate wiring pattern 162b, the lead frames 15c and 15d, the negative electrode-side wiring pattern 162c, and the connection member 34c. Further, the pairs of an IGBT and a free wheeling diode that are each disposed in the semiconductor chips 14a and 14b and are connected in parallel and the pairs of an IGBT and a free wheeling diode that are each disposed in the semiconductor chips 14c and 14d and are connected in parallel are connected in series between the positive electrode-side terminal 211u and the negative electrode-side terminal 212u by the connection member 34a, the positive electrode-side wiring pattern 162a, the lead frames 15a and 15b, the intermediate wiring pattern 162b, the lead frames 15c and 15d, the negative electrode-side wiring pattern 162c, and the connection member 34c.

As illustrated in FIG. 1, the semiconductor module 1 includes gate signal input terminals 171a and 172a, voltage detection terminals 171b, 172b, and 171f, current detection terminals 171c and 172c, and temperature detection terminals 171d, 171e, 172d, and 172e that are arranged over the first portion 111 of the case 11 and the casting area 117u. Hereinafter, all or some of the gate signal input terminals 171a and 172a, the voltage detection terminals 171b, 172b, and 171f, the current detection terminals 171c and 172c, and the temperature detection terminals 171d, 171e, 172d, and 172e are sometimes collectively referred to as "various terminals 17".

Portions of the various terminals 17 are exposed to the outside while rising on the first portion 111 (see FIG. 2), and other portions of the various terminals 17 are exposed to the casting area 117u (see FIG. 1). The portions of the various terminals 17 are connected to a circuit board (not illustrated) on which a control device (not illustrated) that controls the inverter unit for the U-phase, the inverter unit for the V-phase, and the inverter unit for the W-phase is disposed. Although details will be described later, to the other portions of the various terminals 17, the wire wirings 101a to 101j and 102a to 102i for connecting the various terminals 17 to the semiconductor chips 14a to 14d are connected. Because of this configuration, the semiconductor module 1 is capable of transmitting and receiving predetermined signals between the control device and the semiconductor chips 14a to 14d via the various terminals 17.

To the gate signal input terminal 171a, one end of the wire wiring 101a is connected. The other end of the wire wiring 101a is connected to the relay wiring pattern 162e. To the relay wiring pattern 162e, one end of each of the wire wirings 101f and 101g is connected. The other end of the wire wiring 101f is connected to a gate terminal G of the semiconductor chip 14a that is exposed on the same surface as the surface on which the emitter terminal E of the semiconductor chip 14a is exposed. The gate terminal G is a terminal that is connected to a gate of the IGBT disposed in the semiconductor chip 14a. The other end of the wire wiring 101g is connected to a gate terminal G of the semiconductor chip 14b that is exposed on the same surface as the surface on which the emitter terminal E of the semiconductor chip 14b is exposed. The gate terminal G is a terminal that is connected to a gate of the IGBT disposed in the semiconductor chip 14b. As described above, the gate signal input terminal 171a and the semiconductor chips 14a and 14b are mechanically and electrically connected by wire bonding. The IGBT disposed in each of the semiconductor chips 14a and 14b has on/off operation thereof controlled based on a gate signal that is input from the control device (not illustrated) via the gate signal input terminal 171a, the wire wiring 101a, the relay wiring pattern 162d, and the wire wiring 101f or 101g.

To the voltage detection terminal 171b, one end of the wire wiring 101b is connected. The other end of the wire wiring 101b is connected to the relay wiring pattern 162d. To the relay wiring pattern 162d, one end of each of the wire wirings 101h and 101i is connected. The other end of the wire wiring 101h is connected to the emitter terminal E of the semiconductor chip 14a. The other end of the wire wiring 101i is connected to the emitter terminal E of the semiconductor chip 14b. As described above, the voltage detection terminal 171b and the semiconductor chips 14a and 14b are mechanically and electrically connected by wire bonding. Emitter voltage of the IGBT disposed in each of the semiconductor chips 14a and 14b is output to the control device (not illustrated) via the wire wiring 101h or 101i, the relay wiring pattern 162d, the wire wiring 101b, and the voltage detection terminal 171b. The emitter voltage input to the control device is used for detecting current flowing through the IGBTs.

To the current detection terminal 171c, one end of the wire wiring 101c is connected. The other end of the wire wiring 101c is connected to a current detection pad P1 of the semiconductor chip 14b that is exposed on the same surface as the surface on which the emitter terminal E of the semiconductor chip 14*b* is exposed. The current detection pad P1 is connected to a current detection terminal (not illustrated) that is disposed in the semiconductor chip 14*b* and is to detect current flowing through the IGBT. As described above, the current detection terminal 171*c* and the semiconductor chip 14*b* are mechanically and electrically connected by wire bonding. Detected current that is output from the current detection terminal disposed in the semiconductor chip 14*b* is output to the control device (not illustrated) via the wire wiring 101*c* and the current detection terminal 171*c*. The control device determines whether or not abnormal current, such as overcurrent, is flowing through the semiconductor chips 14*a* and 14*b*, based on detected current output from the current detection terminal 171*c*.

To the temperature detection terminal 171*d*, one end of the wire wiring 101*d* is connected. The other end of the wire wiring 101*d* is connected to an anode pad P2 of the semiconductor chip 14*b* that is exposed on the same surface as the surface on which the emitter terminal E of the semiconductor chip 14*b* is exposed. The anode pad P2 is connected to an anode of a diode (not illustrated) that is disposed in the semiconductor chip 14*b* and serves as a temperature detection element. The diode is disposed to detect temperature of the semiconductor chip 14*b*.

To the temperature detection terminal 171*e*, one end of wire wiring 101*e* is connected. The other end of the wire wiring 101*e* is connected to a cathode pad P3 of the semiconductor chip 14*b* that is exposed on the same surface as the surface on which the emitter terminal E of the semiconductor chip 14*b* is exposed. The cathode pad P3 is connected to a cathode of the diode that is disposed in the semiconductor chip 14*b* and serves as a temperature detection element.

As described above, the temperature detection terminals 171*d* and 171*e* and the semiconductor chip 14*b* are mechanically and electrically connected by wire bonding. Voltage of the anode of the diode that is disposed in the semiconductor chip 14*b* and serves as a temperature detection element is output to the control device (not illustrated) via the wire wiring 101*d*. Voltage of the cathode of the diode is output to the control device via the wire wiring 101*e*. The control device determines whether or not temperature of the semiconductor chips 14*a* and 14*b* is an abnormal value, based on voltage between the anode and cathode of the diode.

To the voltage detection terminal 171*f*, one end of the wire wiring 101*j* is connected. The other end of the wire wiring 101*j* is connected to the positive electrode-side wiring pattern 162*a*. As described above, the voltage detection terminal 171*f* and the positive electrode-side wiring pattern 162*a* are mechanically and electrically connected by wire bonding. The positive electrode side of DC voltage that is input to the positive electrode-side terminal 211*u* is output to the control device (not illustrated) via the positive electrode-side wiring pattern 162*a*, the wire wiring 101*j*, and the voltage detection terminal 171*f*. The control device detects the positive electrode side of the DC voltage that is input from the positive electrode-side terminal 211*u* and is supplied to the semiconductor chips 14*a* and 14*b*, based on voltage output from the voltage detection terminal 171*f*.

As illustrated in FIG. 1, to the gate signal input terminal 172*a*, one end of the wire wiring 102*a* is connected. The other end of the wire wiring 102*a* is connected to the relay wiring pattern 162*g*. To the relay wiring pattern 162*g*, one end of each of the wire wirings 102*f* and 102*g* is connected. The other end of the wire wiring 102*f* is connected to a gate terminal G of the semiconductor chip 14*c* that is exposed on the same surface as the surface on which the emitter terminal E of the semiconductor chip 14*c* is exposed. The gate terminal G is a terminal that is connected to a gate of the IGBT disposed in the semiconductor chip 14*c*. The other end of the wire wiring 102*g* is connected to a gate terminal G of the semiconductor chip 14*d* that is exposed on the same surface as the surface on which the emitter terminal E of the semiconductor chip 14*d* is exposed. The gate terminal G is a terminal that is connected to a gate of the IGBT disposed in the semiconductor chip 14*d*. As described above, the gate signal input terminal 172*a* and the semiconductor chips 14*c* and 14*d* are mechanically and electrically connected by wire bonding. The IGBT disposed in each of the semiconductor chips 14*c* and 14*d* has on/off operation thereof controlled based on a gate signal that is input from the control device (not illustrated) via the gate signal input terminal 172*a*, the wire wiring 102*a*, the relay wiring pattern 162*g*, and the wire wiring 102*f* or 102*g*.

To the voltage detection terminal 172*b*, one end of the wire wiring 102*b* is connected. The other end of the wire wiring 102*b* is connected to the relay wiring pattern 162*f*. To the relay wiring pattern 162*f*, one end of each of the wire wirings 102*h* and 102*i* is connected. The other end of the wire wiring 102*h* is connected to the emitter terminal E of the semiconductor chip 14*c*. The other end of the wire wiring 102*i* is connected to the emitter terminal E of the semiconductor chip 14*d*. As described above, the voltage detection terminal 172*b* and the semiconductor chips 14*c* and 14*d* are mechanically and electrically connected by wire bonding. Emitter voltage of the IGBT disposed in each of the semiconductor chips 14*c* and 14*d* is output to the control device (not illustrated) via the wire wiring 102*h* or 102*i*, the relay wiring pattern 162*f*, the wire wiring 102*b*, and the voltage detection terminal 172*b*. The emitter voltage input to the control device is used for detecting current flowing through the IGBTs.

To the current detection terminal 172*c*, one end of the wire wiring 102*c* is connected. The other end of the wire wiring 102*c* is connected to a current detection pad P1 of the semiconductor chip 14*d* that is exposed on the same surface as the surface on which the emitter terminal E of the semiconductor chip 14*d* is exposed. The current detection pad P1 is connected to a current detection terminal (not illustrated) that is disposed in the semiconductor chip 14*d* and is to detect current flowing through the IGBT. As described above, the current detection terminal 172*c* and the semiconductor chip 14*d* are mechanically and electrically connected by wire bonding. Detected current that is output from the current detection terminal disposed in the semiconductor chip 14*d* is output to the control device (not illustrated) via the wire wiring 102*c* and the current detection terminal 172*c*. The control device determines whether or not abnormal current, such as overcurrent, is flowing through the semiconductor chips 14*c* and 14*d*, based on detected current output from the current detection terminal 172*c*.

To the temperature detection terminal 172*d*, one end of the wire wiring 102*d* is connected. The other end of the wire wiring 102*d* is connected to an anode pad P2 of the semiconductor chip 14*d* that is exposed on the same surface as the surface on which the emitter terminal E of the semiconductor chip 14*d* is exposed. The anode pad P2 is connected to an anode of a diode (not illustrated) that is disposed in the semiconductor chip 14*d* and serves as a temperature detection element. The diode is disposed to detect temperature of the semiconductor chip 14*d*.

To the temperature detection terminal 172e, one end of the wire wiring 102e is connected. The other end of the wire wiring 102e is connected to a cathode pad P3 of the semiconductor chip 14d that is exposed on the same surface as the surface on which the emitter terminal E of the semiconductor chip 14d is exposed. The cathode pad P3 is connected to a cathode of the diode that is disposed in the semiconductor chip 14d and serves as a temperature detection element.

As described above, the temperature detection terminals 172d and 172e and the semiconductor chip 14d are mechanically and electrically connected by wire bonding. Voltage of the anode of the diode that is disposed in the semiconductor chip 14d and serves as a temperature detection element is output to the control device (not illustrated) via the wire wiring 102d. Voltage of the cathode of the diode is output to the control device via the wire wiring 102e. The control device determines whether or not temperature of the semiconductor chips 14c and 14d is an abnormal value, based on voltage between the anode and the cathode of the diode.

As illustrated in FIG. 2, the sealing resin 18 is formed on the upper side of the laminated substrate 16 and in an area that extends from the upper side and passes between the case 11 and the insulating substrate 161 and an area that is surrounded by the case 11, the laminated substrate 16, and the cooler 31. The sealing resin 18 cast into the casting area 117u is formed of a material, such as epoxy resin, different from the material of the case 11. The sealing resin 18 is a sealing member that seals constituent elements, such as the semiconductor chips 14a, 14b, 14c, and 14d and the laminated substrate 16, that are disposed in the casting area 117u. The sealing resin 18 is capable of achieving improvement in insulation among the positive electrode-side wiring pattern 162a, the intermediate wiring pattern 162b, and the negative electrode-side wiring pattern 162c that are formed on the insulating substrate 161 by sealing the laminated substrate 16. Because of this capability, the sealing resin 18 is capable of achieving improvement in reliability of the semiconductor module 1.

Returning to FIG. 1, the inverter unit for the V-phase has the same configuration as the configuration of the inverter unit for the U-phase, and the projecting portion 211vb of the positive electrode-side terminal 211v is arranged extending to over a positive electrode-side wiring pattern 162a disposed in the casting area 117v. The positive electrode-side terminal 211v is connected to the positive electrode-side wiring pattern 162a by a connection member (not illustrated) that is arranged in a portion of an area where the projecting portion 211vb and the positive electrode-side wiring pattern 162a overlap each other. The connection member has the same configuration as the configuration of the connection member 34a (see FIG. 2). The connection member is, for example, soldered to the positive electrode-side wiring pattern 162a and is bonded to the projecting portion 211vb by, for example, laser welding.

The projecting portion 212vb of the negative electrode-side terminal 212v is arranged extending to over a negative electrode-side wiring pattern 162c disposed in the casting area 117v. The negative electrode-side terminal 212v is connected to the negative electrode-side wiring pattern 162c by a connection member (not illustrated) that is arranged in a portion of an area where the projecting portion 212vb and the negative electrode-side wiring pattern 162c overlap each other. The connection member has the same configuration as the configuration of the connection member 34c (see FIG. 2). The connection member is, for example, soldered to the negative electrode-side wiring pattern 162c and is bonded to the projecting portion 212vb by, for example, laser welding.

The projecting portion 222v of the power output terminal 22v is arranged extending to over an intermediate wiring pattern 162b disposed in the casting area 117v. The power output terminal 22v is connected to the intermediate wiring pattern 162b by a connection member (not illustrated) that is arranged in a portion of an area where the projecting portion 222v and the intermediate wiring pattern 162b overlap each other. The connection member has the same configuration as the configuration of the connection member 34b (see FIG. 2). The connection member is, for example, soldered to the intermediate wiring pattern 162b and is bonded to the projecting portion 222v by, for example, laser welding.

As illustrated in FIG. 1, the inverter unit for the W-phase has the same configuration as the configuration of the inverter unit for the U-phase, and the projecting portion 211wb of the positive electrode-side terminal 211w is arranged extending to over a positive electrode-side wiring pattern 162a disposed in the casting area 117w. The positive electrode-side terminal 211w is connected to the positive electrode-side wiring pattern 162a by a connection member (not illustrated) that is arranged in a portion of an area where the projecting portion 211wb and the positive electrode-side wiring pattern 162a overlap each other. The connection member has the same configuration as the configuration of the connection member 34a (see FIG. 2). The connection member is, for example, soldered to the positive electrode-side wiring pattern 162a and is bonded to the projecting portion 211wb by, for example, laser welding.

The projecting portion 212wb of the negative electrode-side terminal 212w is arranged extending to over a negative electrode-side wiring pattern 162c disposed in the casting area 117w. The negative electrode-side terminal 212w is connected to the negative electrode-side wiring pattern 162c by a connection member (not illustrated) that is arranged in a portion of an area where the projecting portion 212wb and the negative electrode-side wiring pattern 162c overlap each other. The connection member has the same configuration as the configuration of the connection member 34c (see FIG. 2). The connection member is, for example, soldered to the negative electrode-side wiring pattern 162c and is bonded to the projecting portion 212wb by, for example, laser welding.

The projecting portion 222w of the power output terminal 22w is arranged extending to over an intermediate wiring pattern 162b disposed in the casting area 117w. The power output terminal 22w is connected to the intermediate wiring pattern 162b by a connection member (not illustrated) that is arranged in a portion of an area where the projecting portion 222w and the intermediate wiring pattern 162b overlap each other. The connection member has the same configuration as the configuration of the connection member 34b (see FIG. 2). The connection member is, for example, soldered to the intermediate wiring pattern 162b and is bonded to the projecting portion 222w by, for example, laser welding.

Next, recessed portions 131a, 131b, 132a, 132b, 133a, 133b, 134a, 134b, 135a, 135b, 136a, and 136b that become one of causes of a crack occurring in the sealing resin cast into the casting area 117u and sealing resin (not illustrated) cast into each of the casting areas 117v and 117w will be described.

As illustrated in FIG. 1, the semiconductor module 1 includes at least one recessed portion (in the present embodiment, two recessed portions 131a and 131b and two recessed portions 132a and 132b) that is formed on at least one of the pair of second portions 113 and 114 between a virtual surface VSu that is a boundary between an area in the casting area 117$u$ in which the wire wirings 101$a$ to 101$j$ and 102$a$ to 102$i$ are arranged and an area in the casting area 117$u$ in which none of the wire wirings 101$a$ to 101$j$ and 102$a$ to 102$i$ is arranged and is parallel with the pair of first portions 111 and 112 and the other (in the present embodiment, the first portion 112) of the pair of first portions 111 and 112. Although, in the present embodiment, the semiconductor module 1 includes the recessed portions 131$a$ and 131$b$ on the second portion 113 and the recessed portions 132$a$ and 132$b$ on the second portion 114, the semiconductor module 1 may include at least one recessed portion on only one of the second portion 113 and the second portion 114. In addition, the semiconductor module 1 may include one recessed portion or three or more recessed portions on each of the second portions 113 and 114 or may include one recessed portion or three or more recessed portions on only one of the second portions 113 and 114. In addition, the semiconductor module 1 may include a different number of recessed portions on each of the second portions 113 and 114.

The virtual surface VSu is a surface that, as viewed in the thickness direction of the sealing resin 18, crosses the casting area 117$u$ from one of the recessed portions 131$a$ and 132$a$ that is most separated from the first portion 112 (an example of the other of the pair of first portions) to the second portion 114 or 113 on which the one of the recessed portions 131$a$ and 132$a$ is not formed. The thickness direction of the sealing resin 18 is a direction orthogonal to a pattern forming surface (a surface on which the positive electrode-side wiring pattern 162$a$ and the like are formed) of the insulating substrate 161 arranged in the casting area 117$u$. Specifically, in the present embodiment, the recessed portion 131$a$ and the recessed portion 132$a$ are formed at positions with the same distance from the first portion 112. Therefore, a shortest virtual surface extending from the recessed portion 131$a$ to the second portion 114 on which the recessed portion 131$a$ is not formed and a shortest virtual surface extending from the recessed portion 132$a$ to the second portion 113 on which the recessed portion 132$a$ is not formed are the same surface and, in the present embodiment, are the virtual surface VSu. The virtual surface VSu is also a surface crossing the sealing resin 18 when the sealing resin 18 is cast into the casting area 117$u$. Note that, although the virtual surface VSu is illustrated in FIG. 1 to facilitate understanding, the virtual surface VSu does not exist in the actual semiconductor module 1.

As viewed in the thickness direction of the sealing resin 18, none of the wire wirings 101$a$ to 101$j$ and 102$a$ to 102$i$ is arranged between the first portion 112 (an example of the other of the pair of first portions) and the virtual surface VSu. In addition, as viewed in the thickness direction of the sealing resin 18, none of the recessed portions 131$a$, 131$b$, 132$a$, and 132$b$ is disposed between the first portion 111 (an example of one of the pair of first portions) and the virtual surface VSu. Although details will be described later, in the semiconductor module 1, the recessed portions 131$a$, 131$b$, 132$a$, and 132$b$ are selectively arranged in an area in which none of the wire wirings 101$a$ to 101$j$ and 102$a$ to 102$i$ is arranged. Therefore, the semiconductor module 1 is capable of causing a crack to occur in an area in which none of the wire wirings 101$a$ to 101$j$ and 102$a$ to 102$i$ is arranged within the whole area of the sealing resin 18. Because of this capability, the semiconductor module 1 is capable of preventing the wire wirings 101$a$ to 101$j$ and 102$a$ to 102$i$ from being broken because of a crack having occurred in the sealing resin 18.

The recessed portions 131$a$, 131$b$, 132$a$, and 132$b$ are formed in an area on the upper side of mold partition lines 113L and 114L (see FIG. 2, details will be described later) on the second portions 113 and 114. Each of the recessed portions 131$a$, 131$b$, 132$a$, and 132$b$ has a curved surface-shaped wall surface. Each of the recessed portions 131$a$, 131$b$, 132$a$, and 132$b$ has, for example, a curved surface-shaped surface that follows a portion of a side surface of a round pillar. The recessed portions 131$a$ and 131$b$, for example, extend in a direction substantially orthogonal to the insulating substrate 161. The recessed portions 131$a$ and 131$b$, for example, have the same shape. Each of the recessed portions 132$a$ and 132$b$ has, for example, a curved surface-shaped surface that follows a portion of a side surface of a round pillar. The recessed portions 132$a$ and 132$b$, for example, extend in a direction substantially orthogonal to the insulating substrate 161. The recessed portion 131$a$ and the recessed portion 132$a$ are arranged opposite to each other, and the recessed portion 131$b$ and the recessed portion 132$b$ are arranged opposite to each other. The recessed portions 132$a$ and 132$b$, for example, have the same shape. The recessed portion 131$a$ and the recessed portion 132$a$ have line-symmetric shapes with a virtual straight line (not illustrated) that passes the center of the virtual surface VSu and is orthogonal to the virtual surface VSu as a symmetry axis, and the recessed portion 131$b$ and the recessed portion 132$b$ have line-symmetric shapes with the not-illustrated virtual straight line as a symmetry axis.

The recessed portions 131$a$, 131$b$, 132$a$, and 132$b$ are formed to improve a degree of close adhesion between the sealing resin 18 and the case 11. Each of the recessed portions 131$a$, 131$b$, 132$a$, and 132$b$ has a shape formed by recessing a surface of the second portion 113 or 114 facing the sealing resin 18. Thus, the recessed portions 131$a$, 131$b$, 132$a$, and 132$b$ can increase contact area between the case 11 and the sealing resin 18 to a larger area than in the case where none of the recessed portions 131$a$, 131$b$, 132$a$, and 132$b$ is formed. Because of this capability, the degree of close adhesion between the sealing resin 18 and the case 11 is improved.

As illustrated in FIG. 2, the second portions 113 and 114 have step portions 113S and 114S, respectively, that cause distance between the second portions 113 and 114 on the side on which the semiconductor chips 14$a$ to 14$d$ are arranged to be longer than the distance on the side on which a surface 181 of the sealing resin 18 is located. Edges of the step portions 113S and 114S on the side on which the surface 181 of the sealing resin 18 is located among both edges of the step portions 113S and 114S coincide with the mold partition lines 113L and 114L, respectively. The mold partition lines 113L and 114L are formed depending on shapes of molds for molding the case 11. An upper side portion 11$a$ and a lower side portion 11$b$ of the case 11 in the present embodiment are molded using different molds. The mold partition lines 113L and 114L are equivalent to boundary portions between a mold for molding the upper side portion 11$a$ and a mold for molding the lower side portion 11$b$.

Although details will be described later, the mold partition line 113L or 114L becomes a starting point of occurrence of a crack occurring in the sealing resin 18. A crack occurring in the sealing resin 18 becomes likely to occur caused by recessed portions formed on the second portions 113 and 114. The semiconductor module 1 includes the recessed portions 131$a$ and 131$b$ having the mold partition line 113L at ends and the recessed portions 132$a$ and 132$b$ having the mold partition line 114L at ends in an area between the virtual surface VSu and the first portion 112 in which none of the wire wirings 101*a* to 101*j* and 102*a* to 102*i* is arranged. Because of this configuration, the semiconductor module 1 is configured to intentionally cause a crack to occur in the sealing resin 18 in an area in which none of the wire wirings 101*a* to 101*j* and 102*a* to 102*i* is arranged. As a result, the semiconductor module 1 is capable of preventing the wire wirings 101*a* to 101*j* and 102*a* to 102*i* from being broken because of a crack having occurred in the sealing resin 18.

Returning to FIG. 1, the semiconductor module 1 includes at least one recessed portion (in the present embodiment, two recessed portions 133*a* and 133*b* and two recessed portions 134*a* and 134*b*) that is formed on at least one of the pair of second portions 113 and 114 between a virtual surface VSv that is a boundary between an area in the casting area 117*v* in which the wire wirings 101*a* to 101*j* and 102*a* to 102*i* are arranged and an area in the casting area 117*v* in which none of the wire wirings 101*a* to 101*j* and 102*a* to 102*i* is arranged and is parallel with the pair of first portions 111 and 112 and the first portion 112 (an example of the other of the pair of first portions 111 and 112). Although, in the present embodiment, the semiconductor module 1 includes the recessed portions 133*a* and 133*b* on the second portion 114 and the recessed portions 134*a* and 134*b* on the second portion 115, the semiconductor module 1 may include at least one recessed portion on only one of the second portion 114 and the second portion 115. In addition, the semiconductor module 1 may include one recessed portion or three or more recessed portions on each of the second portions 114 and 115 or may include one recessed portion or three or more recessed portions on only one of the second portions 114 and 115. In addition, the semiconductor module 1 may include a different number of recessed portions on each of the second portions 114 and 115.

The virtual surface VSv is a surface that, as viewed in the thickness direction of the sealing resin (not illustrated), crosses the casting area 117*v* from one of the recessed portions 133*a* and 134*a* that is most separated from the first portion 112 (an example of the other of the pair of first portions) to the second portion 115 or 114 on which the one of the recessed portions 133*a* and 134*a* is not formed. The thickness direction of the sealing resin is a direction orthogonal to a pattern forming surface (a surface on which the positive electrode-side wiring pattern 162*a* and the like are formed) of an insulating substrate 161 arranged in the casting area 117*v*. Specifically, in the present embodiment, the recessed portion 133*a* and the recessed portion 134*a* are formed at positions with the same distance from the first portion 112. Therefore, a shortest virtual surface extending from the recessed portion 133*a* to the second portion 115 on which the recessed portion 133*a* is not formed and a shortest virtual surface extending from the recessed portion 134*a* to the second portion 114 on which the recessed portion 134*a* is not formed are the same surface and, in the present embodiment, are the virtual surface VSv. The virtual surface VSv is also a surface crossing the sealing resin when the sealing resin is cast into the casting area 117*v*. Note that, although the virtual surface VSv is illustrated in FIG. 1 to facilitate understanding, the virtual surface VSv does not exist in the actual semiconductor module 1.

As viewed in the thickness direction of the sealing resin cast into the casting area 117*v*, none of the wire wirings 101*a* to 101*j* and 102*a* to 102*i* is arranged between the first portion 112 (an example of the other of the pair of first portions) and the virtual surface VSv. In addition, as viewed in the thickness direction of the sealing resin, none of the recessed portions 133*a*, 133*b*, 134*a*, and 134*b* is disposed between the first portion 111 (an example of one of the pair of first portions) and the virtual surface VSv. In the semiconductor module 1, the recessed portions 133*a*, 133*b*, 134*a*, and 134*b* are selectively arranged in an area in which none of the wire wirings 101*a* to 101*j* and 102*a* to 102*i* is arranged. Therefore, the semiconductor module 1 is capable of causing a crack to occur in an area in which none of the wire wirings 101*a* to 101*j* and 102*a* to 102*i* is arranged within the whole area of the sealing resin cast into the casting area 117*v*. Because of this capability, the semiconductor module 1 is capable of preventing the wire wirings 101*a* to 101*j* and 102*a* to 102*i* from being broken because of a crack having occurred in the sealing resin.

On the second portion 114 in the casting area 117*v*, a mold partition line (not illustrated) that has the same configuration as the configuration of the mold partition line 113L (see FIG. 2) on the second portion 113 is formed. Likewise, on the second portion 115 in the casting area 117*v*, a mold partition line (not illustrated) that has the same configuration as the configuration of the mold partition line 114L (see FIG. 2) on the second portion 114 is formed. The recessed portions 133*a* and 133*b* are formed in an area on the upper side of the mold partition line formed on the second portion 114 in the casting area 117*v*. The recessed portions 134*a* and 134*b* are formed in an area on the upper side of the mold partition line formed on the second portion 115 in the casting area 117*v*.

Each of the recessed portions 133*a*, 133*b*, 134*a*, and 134*b* has a curved surface-shaped wall surface. Each of the recessed portions 133*a*, 133*b*, 134*a*, and 134*b* has, for example, a curved surface-shaped surface that follows a portion of a side surface of a round pillar. The recessed portions 133*a* and 133*b*, for example, extend in a direction substantially orthogonal to the insulating substrate 161. The recessed portions 133*a* and 133*b*, for example, have the same shape. Each of the recessed portions 134*a* and 134*b* has, for example, a curved surface-shaped surface that follows a portion of a side surface of a round pillar. The recessed portions 134*a* and 134*b*, for example, extend in a direction substantially orthogonal to the insulating substrate 161. The recessed portion 133*a* and the recessed portion 134*a* are arranged opposite to each other, and the recessed portion 133*b* and the recessed portion 134*b* are arranged opposite to each other. The recessed portions 134*a* and 134*b*, for example, have the same shape. The recessed portion 133*a* and the recessed portion 134*a* have line-symmetric shapes with a virtual straight line (not illustrated) that passes the center of the virtual surface VSv and is orthogonal to the virtual surface VSv as a symmetry axis, and the recessed portion 133*b* and the recessed portion 134*b* have line-symmetric shapes with the not-illustrated virtual straight line as a symmetry axis.

The recessed portion 132*a* and the recessed portion 133*a* have line-symmetric shapes with a virtual straight line (not illustrated) that passes the center in the width direction of the second portion 114 and is parallel with an extending direction of the second portion 114 as a symmetry axis. The recessed portion 132*b* and the recessed portion 133*b* have line-symmetric shapes with a virtual straight line (not illustrated) that passes the center in the width direction of the second portion 114 and is parallel with the extending direction of the second portion 114 as a symmetry axis.

The recessed portions 133*a*, 133*b*, 134*a*, and 134*b* are formed to improve a degree of close adhesion between the sealing resin cast into the casting area 117*v* and the case 11. Each of the recessed portions 133*a*, 133*b*, 134*a*, and 134*b* has a shape formed by recessing a surface of the second portion 114 or 115 facing the sealing resin cast into the casting area 117v. Thus, the recessed portions 133a, 133b, 134a, and 134b can increase contact area between the case 11 and the sealing resin cast into the casting area 117v to a larger area than in the case where none of the recessed portions 133a, 133b, 134a, and 134b is formed. Because of this capability, the degree of close adhesion between the sealing resin cast into the casting area 117v and the case 11 is improved.

Although illustration is omitted, the second portions 114 and 115 have step portions (not illustrated) that cause distance between the second portions 114 and 115 on the side on which the semiconductor chips 14a to 14d are arranged to be longer than the distance on the side on which a surface of the sealing resin cast into the casting area 117v is located. The step portions have the same configuration as the configurations of the step portions 113S and 114S. The semiconductor module 1 includes the recessed portions 133a and 133b having a mold partition line with the same configuration as the configuration of the mold partition line 113L at ends and the recessed portions 134a and 134b having a mold partition line with the same configuration as the configuration of the mold partition line 114L at ends in an area between the virtual surface VSv and the first portion 112 in which none of the wire wirings 101a to 101j and 102a to 102i is arranged. Because of this configuration, the semiconductor module 1 is configured to intentionally cause a crack to occur in the sealing resin in an area in which none of the wire wirings 101a to 101j and 102a to 102i is arranged in the casting area 117v. As a result, the semiconductor module 1 is capable of preventing the wire wirings 101a to 101j and 102a to 102i from being broken because of a crack having occurred in the sealing resin in the casting area 117v.

As illustrated in FIG. 1, the semiconductor module 1 includes at least one recessed portion (in the present embodiment, two recessed portions 135a and 135b and two recessed portions 136a and 136b) that is formed on at least one of the pair of second portions 115 and 116 between a virtual surface VSw that is a boundary between an area in the casting area 117w in which the wire wirings 101a to 101j and 102a to 102i are arranged and an area in the casting area 117w in which none of the wire wirings 101a to 101j and 102a to 102i is arranged and is parallel with the pair of first portions 111 and 112 and the first portion 112 (an example of the other of the pair of first portions 111 and 112). Although, in the present embodiment, the semiconductor module 1 includes the recessed portions 135a and 135b on the second portion 115 and the recessed portions 136a and 136b on the second portion 116, the semiconductor module 1 may include at least one recessed portion on only one of the second portion 115 and the second portion 116. In addition, the semiconductor module 1 may include one recessed portion or three or more recessed portions on each of the second portions 115 and 116 or may include one recessed portion or three or more recessed portions on only one of the second portions 115 and 116. In addition, the semiconductor module 1 may include a different number of recessed portions on each of the second portions 115 and 116.

The virtual surface VSw is a surface that, as viewed in the thickness direction of the sealing resin (not illustrated), crosses the casting area 117w from one of the recessed portions 135a and 136a that is most separated from the first portion 112 (an example of the other of the pair of first portions) to the second portion 116 or 115 on which the one of the recessed portions 135a and 136a is not formed. The thickness direction of the sealing resin is a direction orthogonal to a pattern forming surface (a surface on which the positive electrode-side wiring pattern 162a and the like are formed) of an insulating substrate 161 arranged in the casting area 117w. Specifically, in the present embodiment, the recessed portion 135a and the recessed portion 136a are formed at positions with the same distance from the first portion 112. Therefore, a shortest virtual surface extending from the recessed portion 135a to the second portion 116 on which the recessed portion 135a is not formed and a shortest virtual surface extending from the recessed portion 136a to the second portion 115 on which the recessed portion 136a is not formed are the same surface and, in the present embodiment, are the virtual surface VSw. The virtual surface VSw is also a surface crossing the sealing resin when the sealing resin is cast into the casting area 117w. Note that, although the virtual surface VSw is illustrated in FIG. 1 to facilitate understanding, the virtual surface VSw does not exist in the actual semiconductor module 1.

As viewed in the thickness direction of the sealing resin cast into the casting area 117w, none of the wire wirings 101a to 101j and 102a to 102i is arranged between the first portion 112 (an example of the other of the pair of first portions) and the virtual surface VSw. In addition, as viewed in the thickness direction of the sealing resin, none of the recessed portions 135a, 135b, 136a, and 136b is disposed between the first portion 111 (an example of one of the pair of first portions) and the virtual surface VSw. In the semiconductor module 1, the recessed portions 135a, 135b, 136a, and 136b are selectively arranged in an area in which none of the wire wirings 101a to 101j and 102a to 102i is arranged. Therefore, the semiconductor module 1 is capable of causing a crack to occur in an area in which none of the wire wirings 101a to 101j and 102a to 102i is arranged within the whole area of the sealing resin cast into the casting area 117w. Because of this capability, the semiconductor module 1 is capable of preventing the wire wirings 101a to 101j and 102a to 102i from being broken because of a crack having occurred in the sealing resin.

On the second portion 115 in the casting area 117w, a mold partition line (not illustrated) that has the same configuration as the configuration of the mold partition line 113L (see FIG. 2) on the second portion 113 is formed. Likewise, on the second portion 116 in the casting area 117w, a mold partition line (not illustrated) that has the same configuration as the configuration of the mold partition line 114L (see FIG. 2) on the second portion 114 is formed. The recessed portions 135a and 135b are formed in an area on the upper side of the mold partition line formed on the second portion 115 in the casting area 117w. The recessed portions 136a and 136b are formed in an area on the upper side of the mold partition line formed on the second portion 116 in the casting area 117w.

Each of the recessed portions 135a, 135b, 136a, and 136b has a curved surface-shaped wall surface. Each of the recessed portions 135a, 135b, 136a, and 136b has, for example, a curved surface-shaped surface that follows a portion of a side surface of a round pillar. The recessed portions 135a and 135b, for example, extend in a direction substantially orthogonal to the insulating substrate 161. The recessed portions 135a and 135b, for example, have the same shape. Each of the recessed portions 136a and 136b has, for example, a curved surface-shaped surface that follows a portion of a side surface of a round pillar. The recessed portions 136a and 136b, for example, extend in a direction substantially orthogonal to the insulating substrate 161. The recessed portion 135a and the recessed portion 136a are arranged opposite to each other, and the recessed portion 135b and the recessed portion 136b are arranged opposite to each other. The recessed portions 136*a* and 136*b*, for example, have the same shape. The recessed portion 135*a* and the recessed portion 136*a* have line-symmetric shapes with a virtual straight line (not illustrated) that passes the center of the virtual surface VSw and is orthogonal to the virtual surface VSw as a symmetry axis, and the recessed portion 135*b* and the recessed portion 136*b* have line-symmetric shapes with the not-illustrated virtual straight line as a symmetry axis.

The recessed portion 134*a* and the recessed portion 135*a* have line-symmetric shapes with a virtual straight line (not illustrated) that passes the center in the width direction of the second portion 115 and is parallel with an extending direction of the second portion 115 as a symmetry axis. The recessed portion 134*b* and the recessed portion 135*b* have line-symmetric shapes with a virtual straight line (not illustrated) that passes the center in the width direction of the second portion 115 and is parallel with the extending direction of the second portion 115 as a symmetry axis.

The recessed portions 135*a*, 135*b*, 136*a*, and 136*b* are formed to improve a degree of close adhesion between the sealing resin cast into the casting area 117*w* and the case 11. Each of the recessed portions 135*a*, 135*b*, 136*a*, and 136*b* has a shape formed by recessing a surface of the second portion 115 or 116 facing the sealing resin cast into the casting area 117*w*. Thus, the recessed portions 135*a*, 135*b*, 136*a*, and 136*b* can increase contact area between the case 11 and the sealing resin to a larger area than in the case where none of the recessed portions 135*a*, 135*b*, 136*a*, and 136*b* is formed. Because of this capability, the degree of close adhesion between the sealing resin cast into the casting area 117*w* and the case 11 is improved.

Although illustration is omitted, the second portions 115 and 116 have step portions (not illustrated) that cause distance between the second portions 115 and 116 on the side on which the semiconductor chips 14*a* to 14*d* are arranged to be longer than the distance on the side on which a surface of the sealing resin cast into the casting area 117*w* is located. The step portions have the same configuration as the configurations of the step portions 113S and 114S. The semiconductor module 1 includes the recessed portions 135*a* and 135*b* having a mold partition line with the same configuration as the configuration of the mold partition line 113L at ends and the recessed portions 136*a* and 136*b* having a mold partition line with the same configuration as the configuration of the mold partition line 114L at ends in an area between the virtual surface VSw and the first portion 112 in which none of the wire wirings 101*a* to 101*j* and 102*a* to 102*i* is arranged. Because of this configuration, the semiconductor module 1 is configured to intentionally cause a crack to occur in the sealing resin in an area in which none of the wire wirings 101*a* to 101*j* and 102*a* to 102*i* is arranged in the casting area 117*w*. As a result, the semiconductor module 1 is capable of preventing the wire wirings 101*a* to 101*j* and 102*a* to 102*i* from being broken because of a crack having occurred in the sealing resin in the casting area 117*w*.

(Advantageous Effects of Semiconductor Module)

Figure 5:
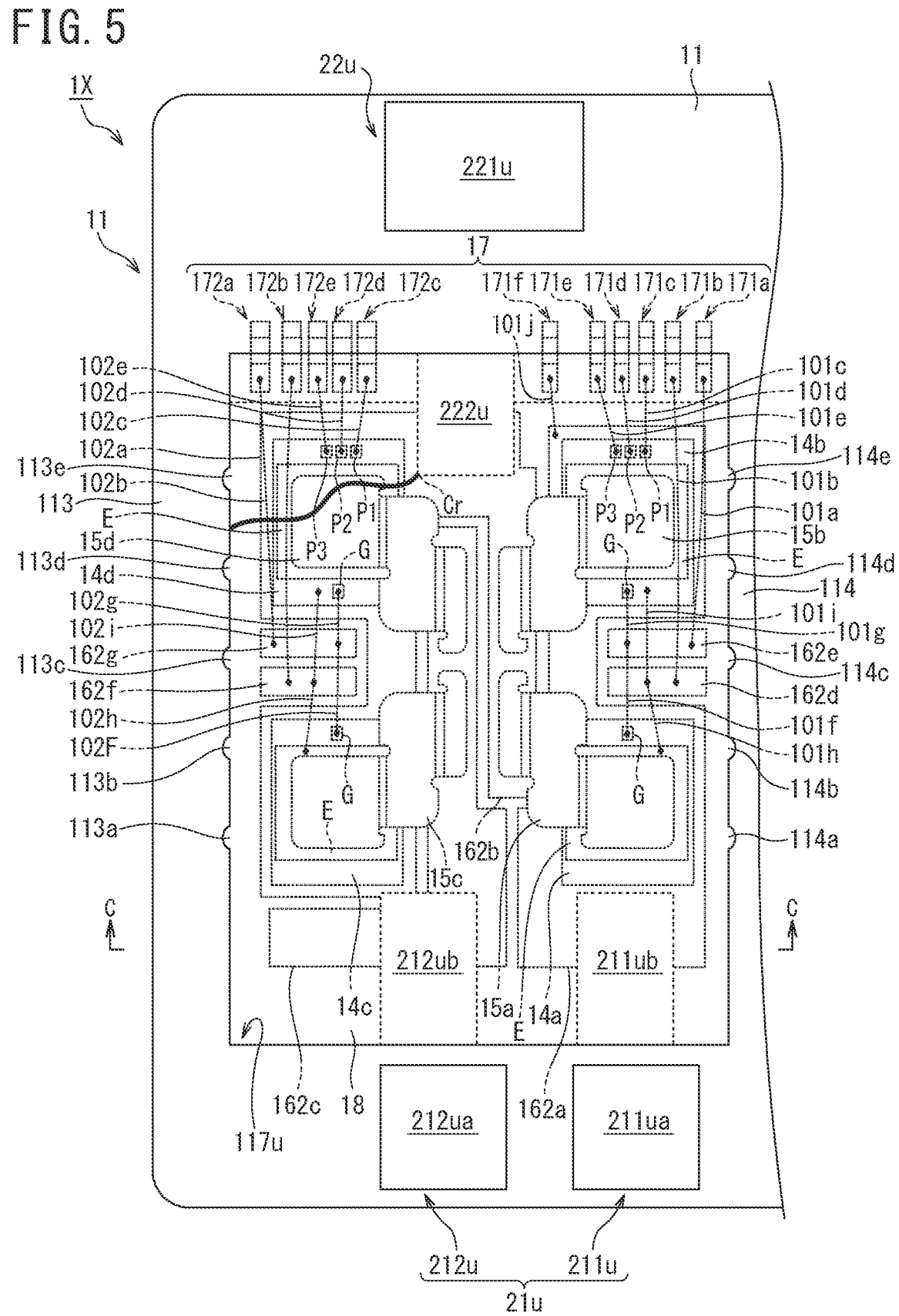
FIG. 5 is a diagram for a description of a crack occurring in sealing resin included in a semiconductor module according to a comparative example and is a diagram schematically illustrative of a portion of a plane of the semiconductor module.
Figure 6:
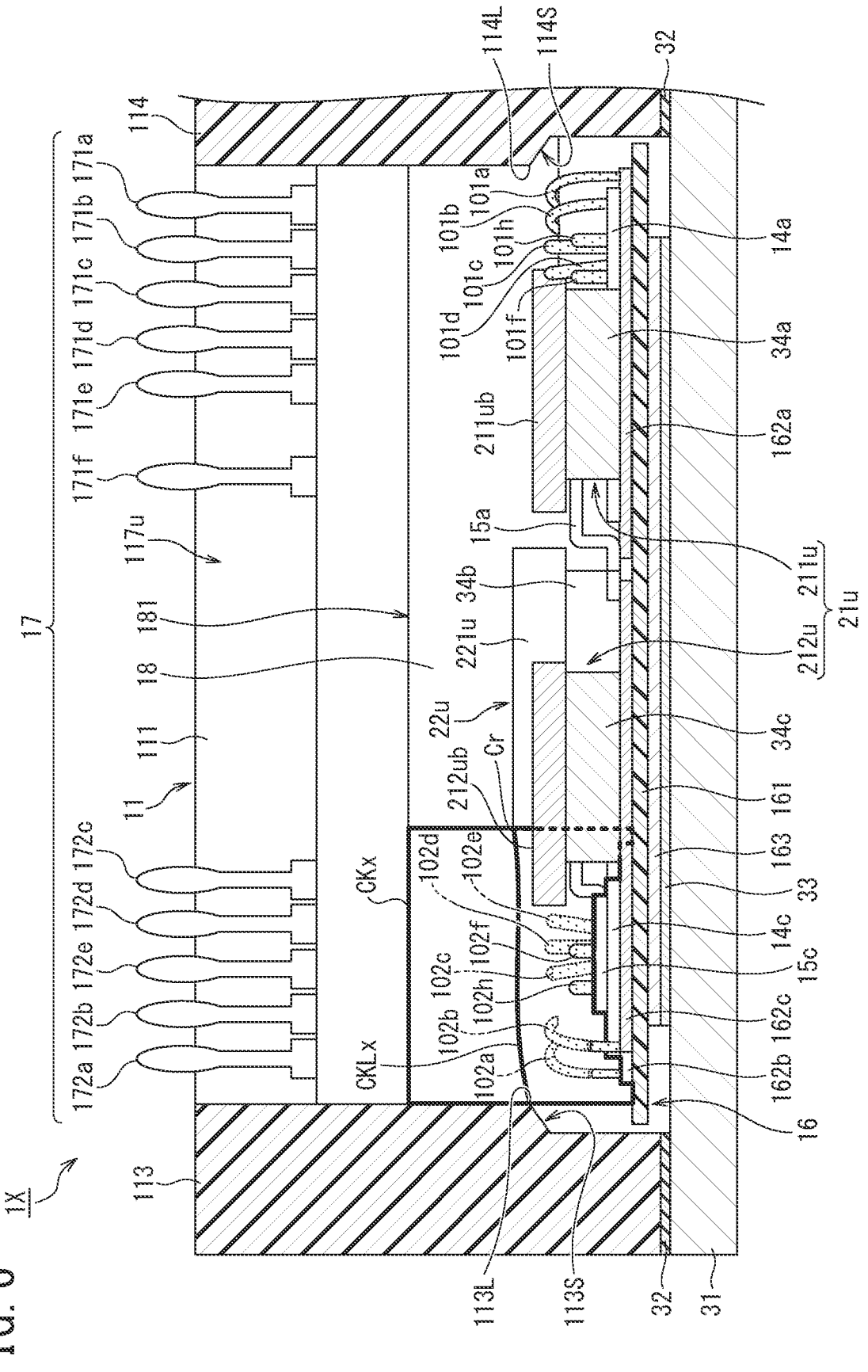
FIG. 6 is another diagram for a description of the crack occurring in the sealing resin included in the semiconductor module according to the comparative example and is a diagram schematically illustrative of a cross section of the semiconductor module taken along the line C-C illustrated in FIG. 5.

Advantageous effects of the semiconductor module 1 according to the present embodiment will be described using FIGS. 3 to 6 while referring to FIGS. 1 and 2. FIG. 3 is a diagram schematically illustrative of a vicinity of the inverter unit for the U-phase disposed in the semiconductor module 1. In FIG. 3, to facilitate understanding, the semiconductor chips 14*a* to 14*d* and the like that constitute the inverter unit for the U-phase and cannot be visually recognized because of being sealed by the sealing resin 18 are illustrated by dashed lines. FIG. 4 is a diagram schematically illustrative of a cross section of the semiconductor module 1 taken along the line B-B illustrated in FIG. 3. FIG. 5 is a diagram schematically illustrative of a vicinity of an inverter unit for a U-phase disposed in a semiconductor module 1X serving as a comparative example. In FIG. 5, to facilitate understanding, semiconductor chips 14*a* to 14*d* and the like that constitute the inverter unit for the U-phase and cannot be visually recognized because of being sealed by sealing resin 18 are illustrated by dashed lines. FIG. 6 is a diagram schematically illustrative of a cross section of the semiconductor module 1X taken along the line C-C illustrated in FIG. 5. Note that constituent elements of the semiconductor module 1X that achieves the same effects and functions as the constituent elements of the semiconductor module 1 will be denoted by the same reference numerals and description thereof will be omitted.

When temperature of the semiconductor module 1 is changed in a power cycle test, the case 11 and the sealing resin 18 are deformed. In addition, since, when the semiconductor module 1 is in operation, the semiconductor module 1 overheats due to heat generated by the semiconductor chips 14*a* to 14*d*, the case 11 and the sealing resin 18 are deformed. Since resin for forming the case 11 and resin for forming the sealing resin 18 are different, the amounts of deformation of the case 11 and the sealing resin 18 differ from each other. As a result, stress according to the amounts of deformation of the case 11 and the sealing resin 18 is generated in the sealing resin 18.

In the case 11, the recessed portions 131*a*, 131*b*, 132*a*, and 132*b* have higher degrees of close adhesion with the sealing resin 18 than the other portion. Thus, stress applied to the sealing resin 18 by the recessed portions 131*a*, 131*b*, 132*a*, and 132*b* and stress applied to the sealing resin 18 by portions of the second portions 113 and 114 other than the recessed portions 131*a*, 131*b*, 132*a*, and 132*b* are different. Further, ends on the laminated substrate 16 side of both ends of the recessed portions 131*a*, 131*b*, 132*a*, and 132*b* are arranged on the mold partition line 113L or 114L. The mold partition lines 113L and 114L are portions that protrude to the casting area 117*u* on inner side surfaces (that is, surfaces facing the casting area 117*u*) of the second portions 113 and 114, respectively. Thus, a crack starting from either the mold partition line 113L or 114L occurs in the sealing resin 18.

On the mold partition lines 113L and 114L, there exist a plurality of places that may become a starting point of a crack occurring in the sealing resin 18. A first one of such places is any one of the recessed portions 131*a*, 131*b*, 132*a*, and 132*b*. A second one of such places is an area between recessed portions adjacent to each other (in the present embodiment, an area between the recessed portion 131*a* and the recessed portion 131*b* or an area between the recessed portion 132*a* and the recessed portion 132*b*) of the plurality of recessed portions. A third one of such places is an area between one of the first portions 111 and 112 that is relatively close to a recessed portion and the recessed portion (in the present embodiment, an area between the recessed portion 131*b* or 132*b* and the first portion 112). Therefore, a portion of the mold partition line 113L or 114L between the virtual surface VSu and the first portion 112 is an area that becomes a starting point of a crack.

As viewed in the thickness direction of the sealing resin 18, the recessed portions 131*a*, 131*b*, 132*a*, and 132*b* are disposed between the first portion 112 and the virtual surface VSu (see FIG. 2). However, as viewed in the direction, none of the wire wirings 101*a* to 101*j* and 102*a* to 102*i* is arranged between the first portion 112 and the virtual surface VSu.

That is, none of the wire wirings 101a to 101j and 102a to 102i is arranged at a place that is likely to be a starting point of a crack.

On the other hand, as viewed in the thickness direction of the sealing resin 18, no recessed portion is disposed on the second portions 113 and 114 between the first portion 111 and the virtual surface VSu. However, as viewed in the direction, the wire wirings 101a to 101j and 102a to 102i are arranged between the first portion 111 and the virtual surface VSu. That is, the wire wirings 101a to 101j and 102a to 102i are arranged at a place that is unlikely to be a starting point of a crack.

Because of this configuration, as illustrated in FIGS. 3 and 4, the semiconductor module 1 is configured to intentionally cause a crack CK to occur in the sealing resin 18 in an area in which none of the wire wirings 101a to 101j and 102a to 102i is arranged, as well as preventing a crack from occurring in the sealing resin 18 in an area in which the wire wirings 101a to 101j and 102a to 102i are arranged. As a result, the semiconductor module 1 is capable of preventing the wire wirings 101a to 101j and 102a to 102i from being broken because of a crack CK having occurred in the sealing resin 18.

As illustrated in FIG. 3, the power input terminal 21u has corner portions on portions that are arranged in the casting area 117u. The power input terminal 21u is equivalent to one terminal of the power input terminal 21u and the power output terminal 22u that has the projecting portions 211ub and 212ub (an example of the portion) arranged in an area in which none of the wire wirings 101a to 101j and 102a to 102i is arranged. More specifically, the positive electrode-side terminal 211u and the negative electrode-side terminal 212u have corner portions Cr on the projecting portion 211ub and the projecting portion 212ub that are arranged in the casting area 117u, respectively. The corner portions Cr of the projecting portions 211ub and 212ub are arranged pointing to the second portions 113 and 114. That is, the corner portions Cr of the projecting portions 211ub and 212ub are arranged pointing to the mold partition lines 113L and 114L. Therefore, the semiconductor module 1 causes a crack to occur between one of areas 113Lp and 114Lp of the step portions 113S and 114S between the first portion 112 on which the power input terminal 21u is disposed and the virtual surface VSu and one of the corner portions Cr. In other words, as illustrated in FIG. 4, the semiconductor module 1 is capable of causing a crack line CKL that occurs with the mold partition line 113L as a starting point to terminate at a corner portion Cr of the projecting portion 212ub. In addition, the semiconductor module 1 is capable of causing a crack line (not illustrated) that occurs with the mold partition line 114L as a starting point to terminate at a corner portion Cr of the projecting portion 211ub.

As described above, the semiconductor module 1 includes the laminated substrate 16 that includes the positive electrode-side wiring pattern 162a that is connected to the positive electrode-side terminal 211u that the power input terminal 21u has, the intermediate wiring pattern 162b to which the semiconductor chips 14a and 14b (an example of one of a plurality of semiconductor chips) and the power output terminal 22u are connected, and the negative electrode-side wiring pattern 162c to which the semiconductor chips 14c and 14d (an example of remaining one of the semiconductor chips) and the negative electrode-side terminal 212u that the power input terminal 21u includes are connected.

The step portions 113S and 114S and the corner portions Cr are arranged at positions further away from the laminated substrate 16 than the lead frames 15a and 15b (an example of a positive electrode-side lead frame) that connect the semiconductor chips 14a and 14b and the intermediate wiring pattern 162b, respectively, the lead frames 15c and 15d (an example of a negative electrode-side lead frame) that connect the semiconductor chips 14c and 14d and the negative electrode-side wiring pattern 162c, respectively, and the plurality of semiconductor chips 14a to 14d. That is, the step portions 113S and 114S and the corner portions Cr are arranged at positions higher than the lead frames 15a and 15b that connect the semiconductor chips 14a and 14b and the negative electrode-side wiring pattern 162c, respectively, the lead frames 15c and 15d that connect the semiconductor chips 14c and 14d and the negative electrode-side wiring pattern 162c, respectively, and the plurality of semiconductor chips 14a to 14d with reference to the laminated substrate 16. Thus, no structure having a corner portion exists between the step portions 113S and 114S and the corner portions Cr. Because of this configuration, the semiconductor module 1 is capable of causing a crack line CKL that occurs with the mold partition line 113L as a starting point to terminate at a corner portion Cr of the projecting portion 212ub and a crack line that occurs with the mold partition line 114L as a starting point to terminate at a corner portion Cr of the projecting portion 211ub.

Even when a crack extends to the surface 181 side of the sealing resin 18 with the crack line CKL as a starting point, none of the wire wirings 101a to 101j and 102a to 102i exists between the crack line CKL and the surface 181 of the sealing resin 18. In addition, even when a crack extends to the laminated substrate 16 side with the crack line CKL as a starting point, none of the wire wirings 101a to 101j and 102a to 102i exists between the crack line CKL and the laminated substrate 16. Therefore, the semiconductor module 1 is capable of preventing the wire wirings 101a to 101j and 102a to 102i from being broken even when a crack CK occurs in the sealing resin 18.

In contrast, as illustrated in FIG. 5, the semiconductor module 1X according to the comparative example includes recessed portions 113a, 113b, 113c, 113d, and 113e over an entire second portion 113 and recessed portions 114a, 114b, 114c, 114d, and 114e over an entire second portion 114. In addition, as illustrated in FIG. 6, the semiconductor module 1X includes step portions 113S and 114S and mold partition lines 113L and 114L. Thus, in the semiconductor module 1X, the entire mold partition lines 113L and 114L may become a starting point of a crack.

As a result, as illustrated in FIG. 6, in the semiconductor module 1X, there are some cases where a crack line CKLx occurs that starts from the mold partition line 113L between, for example, the recessed portion 113d and the recessed portion 113e that are disposed in an area in which wire wirings 101a to 101j and 102a to 102i exist and terminates at a corner portion Cr of a projecting portion 222u of a power output terminal 22u. As illustrated in FIGS. 5 and 6, a crack CKx that occurs by a crack extending to the surface 181 side of sealing resin 18 with the crack line CKLx as a starting point and another crack extending to the laminated substrate 16 side with the crack line CKLx as a starting point crosses the wire wirings 102a and 102b. As a result, the wire wirings 102a and 102b are broken by the crack CKx. The wire wiring 102a is a wiring through which a gate signal input to the semiconductor chips 14c and 14d is transmitted. Therefore, the wire wirings 102a and 102b being broken causes the gate signal not to be input to the semiconductor chips 14c and 14d. As a result, the semiconductor chips 14c and 14d cease to perform operation based on control by the control device, and the semiconductor module 1X thus becomes unable to execute desired operation.

When a crack occurs in the sealing resin 18, stress having been generated in the sealing resin 18 is released. Thus, there is no chance that a plurality of cracks occur in the sealing resin 18. Since, because of this configuration, the semiconductor module 1 is capable of intentionally causing a crack to occur in an area in which none of the wire wirings 101*a* to 101*j* and 102*a* to 102*i* is arranged, the wire wirings 101*a* to 101*j* and 102*a* to 102*i* are prevented from being broken.

Although detailed description is omitted, the semiconductor module 1 includes recessed portions 133*a*, 133*b*, 134*a*, and 134*b* and projecting portions 211*vb* and 212*vb* in the casting area 117*v*. In addition, the semiconductor module 1 includes recessed portions 135*a*, 135*b*, 136*a*, and 136*b* and projecting portions 211*wb* and 212*wb* in the casting area 117*w*. Since, for this reason, advantageous effects similar to those for the casting area 117*u* can also be achieved in the casting areas 117*v* and 117*w*, the semiconductor module 1 is capable of preventing the wire wirings 101*a* to 101*j* and 102*a* to 102*i* that are arranged in each of the casting areas 117*v* and 117*w* from being broken. Therefore, the semiconductor module 1 is also capable of achieving life extension.

As described in the foregoing, the semiconductor module 1 according to the present embodiment includes the semiconductor chips 14*a* to 14*d*, the sealing resins 18 configured to seal the semiconductor chips 14*a* to 14*d*, the casting areas 117*u*, 117*v*, and 117*w* into which the sealing resins 18 are cast, the case 11 including the pair of first portions 111 and 112 arranged opposite to each other with the casting areas 117*u*, 117*v*, and 117*w* interposed therebetween and having linear shapes, the pair of second portions 113 and 114, the pair of second portions 114 and 115, and the pair of second portions 115 and 116 arranged opposite to each other with the casting areas 117*u*, 117*v*, and 117*w* interposed therebetween, respectively, between the pair of first portions 111 and 112 and having linear shapes, the wire wirings 101*a* to 101*j* and 102*a* to 102*i* sealed in the sealing resins 18 while being located closer to the first portion 111 and connected to the semiconductor chips 14*a* to 14*d* and through which signals input to the semiconductor chips 14*a* to 14*d* or output from the semiconductor chips 14*a* to 14*d* are transmitted, the recessed portions 131*a*, 131*b*, 132*a*, and 132*b* formed on the pair of second portions 113 and 114 between the virtual surface VSu, the virtual surface VSu being a boundary between an area in the casting area 117*u* in which the wire wirings 101*a* to 101*j* and 102*a* to 102*j* are arranged and an area in the casting area 117*u* in which none of the wire wirings 101*a* to 101*j* and 102*a* to 102*i* is arranged and being parallel with the pair of first portions 111 and 112, and the first portion 112, the recessed portions 133*a*, 133*b*, 134*a*, and 134*b* formed on the pair of second portions 114 and 115 between the virtual surface VSv, the virtual surface VSv being a boundary between an area in the casting area 117*v* in which the wire wirings 101*a* to 101*j* and 102*a* to 102*j* are arranged and an area in the casting area 117*v* in which none of the wire wirings 101*a* to 101*j* and 102*a* to 102*i* is arranged and being parallel with the pair of first portions 111 and 112, and the first portion 112, and the recessed portions 135*a*, 135*b*, 136*a*, and 136*b* formed on the pair of second portions 115 and 116 between the virtual surface VSw, the virtual surface VSw being a boundary between an area in the casting area 117*w* in which the wire wirings 101*a* to 101*j* and 102*a* to 102*j* are arranged and an area in the casting area 117*w* in which none of the wire wirings 101*a* to 101*j* and 102*a* to 102*i* is arranged and being parallel with the pair of first portions 111 and 112, and the first portion 112.

Because of this configuration, the semiconductor module 1 is capable of preventing the wire wirings 101*a* to 101*j* and 102*a* to 102*i* from being broken because of a crack CK having occurred in the sealing resin 18.

The present invention is not limited to the above-described embodiments, and various modification are possible.

Although, in the above-described embodiment, the recessed portions that the semiconductor module includes have cylindrical wall surfaces, the recessed portions may have other shapes, such as a circular cone shape, a rectangular parallelepiped shape, and a pyramid shape, as long as the shape enables contact area with the sealing resin to be increased.

In addition, although the recessed portions that the semiconductor module includes extend in a direction substantially orthogonal to the insulating substrate that is disposed in the laminated substrate, the recessed portions may be inclined with respect to a direction orthogonal to the insulating substrate.

Although, in the above-described embodiment, the semiconductor module is configured to cause a crack line to terminate at the power input terminal, the present invention is not limited thereto. When various types of terminals are arranged on the power input terminal side, the semiconductor module may cause a crack line to terminate at the power output terminal. When various types of terminals are arranged on the power input terminal side, wire wirings are arranged closer to the power input terminal side. Thus, in this case, the semiconductor module is also capable of achieving the same advantageous effects as those achievable by the above-described embodiment.

Although, in the above-described embodiment, the semiconductor module is configured to cause a crack line to terminate at the power input terminal, the present invention is not limited thereto. For example, the semiconductor module may be configured to cause a crack line to terminate at, in addition to a structure such as the power input terminal and the power output terminal, a corner portion of a structure (for example, a lead frame or a semiconductor chip) that is arranged at a position at substantially the same height as or higher than a mold partition line in an area of a casting area in which no wire wiring is arranged (equivalent to areas between the virtual surfaces VSu, VSv, and VSw and the first portion 112 in the above-described embodiment). In this case, the semiconductor module is also capable of achieving the same advantageous effects as those achievable by the above-described embodiment.

The technical scope of the present invention is not limited to the illustrated and described exemplary embodiments, but includes all embodiments causing an effect equivalent to the object of the present invention. Furthermore, the technical scope of the present invention is not limited to combinations of features of the inventions defined by the claims, but can be defined by all desired combinations of specific features among all the disclosed features.

REFERENCE SIGNS LIST 1, 1X Semiconductor module
11 Case
11*a* Upper side portion
11*b* Lower side portion
14*a*, 14*b*, 14*c*, 14*d* Semiconductor chip
15*a*, 15*b*, 15*c*, 15*d* Lead frame
16 Laminated substrate
17 Various terminals
18 Sealing resin 21*u*, 21*v*, 21*w* Power input terminal
22*u*, 22*v*, 22*w* Power output terminal
31 Cooler
32 Adhesive agent
34*a*, 34*b*, 34*c* Connection member
101*a*, 101*b*, 101*c*, 101*d*, 101*e*, 101*f*, 101*g*, 101*h*, 101*i*, 101*j*, 102*a*, 102*b*, 102*c*, 102*d*, 102*e*, 102*f*, 102*g*, 102*h*, 102*i* Wire wiring
111, 112 First portion
113, 114, 115, 116 Second portion
113*a*, 113*b*, 113*c*, 113*d*, 113*e*, 114*a*, 114*b*, 114*c*, 114*d*, 114*e*, 131*a*, 131*b*, 132*a*, 132*b*, 133*a*, 133*b*, 134*a*, 134*b*, 135*a*, 135*b*, 136*a*, 136*b* Recessed portion
113L, 114L Mold partition line
113Lp, 114Lp Area
113S, 114S Step portion
117*u*, 117*v*, 117*w* Casting area
161 Insulating substrate
162*a* Positive electrode-side wiring pattern
162*b* Intermediate wiring pattern
162*c* Negative electrode-side wiring pattern
162*d*, 162*e*, 162*f*, 162*g* Relay wiring pattern
163 Heat conduction pattern
171*a*, 172*a* Gate signal input terminal
171*b*, 172*b* Voltage detection terminal
171*c*, 172*c* Current detection terminal
171*d*, 172*d* Temperature detection terminal
171*e*, 172*e* Temperature detection terminal
171*f* Voltage detection terminal
181 Surface
211*u*, 211*v*, 211*w* Positive electrode-side terminal
211*ua*, 211*va*, 211*wa*, 212*ua*, 212*va*, 212*wa*, 221*u*, 221*v*, 221*w* Fastening portion
211*ub*, 211*vb*, 211*wb*, 212*ub*, 212*vb*, 212*wb*, 222*u*, 222*v*, 222*w* Projecting portion
212*u*, 212*v*, 212*w* Negative electrode-side terminal
CK, CKx Crack
CKL, CKLx Crack line
Cr Corner portion
E Emitter terminal
G Gate terminal
L113, L114 Step portion
P1 Current detection pad
P2 Anode pad
P3 Cathode pad
VSu, VSv, VSw Virtual surface
The invention claimed is:

1. A semiconductor module comprising:
a semiconductor chip;
sealing resin configured to seal the semiconductor chip;
a case including a space into which the sealing resin is cast, a pair of first portions arranged opposite to each other with the space interposed between the first portions and having a linear shape, and a pair of second portions arranged opposite to each other with the space interposed between the second portions between the pair of first portions and having a linear shape;
a wire wiring sealed by the sealing resin while being located closer to one of the pair of first portions and connected to the semiconductor chip and through which a signal input to the semiconductor chip or output from the semiconductor chip is transmitted; and
at least one recessed portion formed on at least one of the pair of second portions between a virtual surface, the virtual surface being a boundary between an area in the space in which the wire wiring is arranged and an area in the space in which the wire wiring is not arranged and being parallel with the pair of first portions, and the other of the pair of first portions.

2. The semiconductor module according to claim 1, wherein, as viewed in a thickness direction of the sealing resin, the virtual surface is a surface crossing the space from the recessed portion most separated from the other of the pair of first portions to the second portion on which the recessed portion is not formed.

3. The semiconductor module according to claim 1, wherein, as viewed in a thickness direction of the sealing resin, the wire wiring is not arranged between the other of the pair of first portions and the virtual surface.

4. The semiconductor module according to claim 1, wherein, as viewed in a thickness direction of the sealing resin, the recessed portion is not disposed between the one of the pair of first portions and the virtual surface.

5. The semiconductor module according to claim 1 further comprising:
a power input terminal disposed in one of the first portions while a portion of the power input terminal is arranged in the space and to which power to be supplied to the semiconductor chip is input; and
a power output terminal disposed in the other of the first portions while a portion of the power output terminal is arranged in the space and from which power from the semiconductor chip is output.

6. The semiconductor module according to claim 5, wherein
the pair of second portions have step portions causing distance between the second portions on a side on which the semiconductor chip is arranged to be longer than distance between the second portions on a side on which a surface of the sealing resin is located, and
one terminal of the power input terminal and the power output terminal, the one terminal having the portion arranged in an area in which the wire wirings is not arranged, has a corner portion on the portion.

7. The semiconductor module according to claim 6 further comprising
a laminated substrate including a positive electrode-side wiring pattern connected to a positive electrode-side terminal included in the power input terminal, an intermediate wiring pattern to which one of a plurality of the semiconductor chips and the power output terminal are connected, and a negative electrode-side wiring pattern to which remaining one of the semiconductor chips and a negative electrode-side terminal included in the power input terminal are connected,
wherein the step portions and the corner portion are arranged at positions further away from the laminated substrate than a positive electrode-side lead frame connecting the one of the semiconductor chips and the intermediate wiring pattern, a negative electrode-side lead frame connecting the remaining one of the semiconductor chips and the negative electrode-side wiring pattern, and a plurality of the semiconductor chips.

8. The semiconductor module according to claim 1, wherein the recessed portion has a curved surface-shaped wall surface.

9. The semiconductor module according to claim 1, wherein
the case has a plurality of the spaces,
the pair of first portions are shared as some of constituent elements defining each of the plurality of the spaces, and at least one of the pair of second portions are shared as one of constituent elements defining each of the spaces adjacent to each other.

\* \* \* \* \*